US009666592B2

(12) United States Patent
Yun et al.

(10) Patent No.: US 9,666,592 B2
(45) Date of Patent: May 30, 2017

(54) MEMORY DEVICES AND METHODS OF FABRICATING THE SAME

(71) Applicants: Tae Hwan Yun, Suwon-si (KR); Joon Hee Lee, Seongnam-si (KR); Ji Young Kim, Goyang-si (KR)

(72) Inventors: Tae Hwan Yun, Suwon-si (KR); Joon Hee Lee, Seongnam-si (KR); Ji Young Kim, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/861,262

(22) Filed: Sep. 22, 2015

(65) Prior Publication Data

US 2016/0093631 A1 Mar. 31, 2016

(30) Foreign Application Priority Data

Sep. 29, 2014 (KR) ........................ 10-2014-0130121

(51) Int. Cl.
*H01L 27/1157* (2017.01)
*H01L 27/11582* (2017.01)
(Continued)

(52) U.S. Cl.
CPC .... *H01L 27/1157* (2013.01); *H01L 27/11582* (2013.01); *H01L 21/8221* (2013.01); *H01L 21/8229* (2013.01)

(58) Field of Classification Search
CPC .......... H01L 27/1157; H01L 27/11582; H01L 27/11529; H01L 27/11568; H01L 27/11;
(Continued)

(56) References Cited

U.S. PATENT DOCUMENTS

| 8,133,784 B2 | 3/2012 | Chung et al. |
| 8,436,416 B2 | 5/2013 | Ichinose et al. |

(Continued)

FOREIGN PATENT DOCUMENTS

| KR | 1020090083124 | 8/2009 |
| KR | 1020100063385 | 6/2010 |

(Continued)

*Primary Examiner* — Moazzam Hossain
*Assistant Examiner* — Farun Lu
(74) *Attorney, Agent, or Firm* — Myers Bigel, P.A.

(57) ABSTRACT

A memory device includes a substrate having common source regions thereon, common source lines extending along a surface of the substrate and contacting the common source regions, respectively, and channel structures extending away from the surface of the substrate between the common source lines. The common source lines define a unit cell of the memory device therebetween. The memory device further includes an electrode stack structure having interlayer insulating layers and conductive electrode layers that are alternately stacked along sidewalls of the channel structures. The conductive electrode layers define respective gates of selection transistors and memory cell transistors of the memory device. An isolation insulating layer, which includes a portion of a sacrificial layer, is disposed between adjacent ones of the interlayer insulating layers in the stack structure. The isolation insulating layer divides at least one of the conductive electrode layers in the stack structure into electrically separate portions.

7 Claims, 28 Drawing Sheets

(51) Int. Cl.
*H01L 21/822* (2006.01)
*H01L 21/8229* (2006.01)

(58) Field of Classification Search
CPC ............... H01L 27/1252; H01L 27/108; H01L 21/8221; H01L 21/8229; H01L 21/8239
See application file for complete search history.

(56) References Cited

U.S. PATENT DOCUMENTS

| | | |
|---|---|---|
| 8,440,528 B2 | 5/2013 | Kito et al. |
| 8,541,831 B2 | 9/2013 | Chae et al. |
| 8,575,675 B2 | 11/2013 | Park et al. |
| 8,614,126 B1 | 12/2013 | Lee et al. |
| 8,729,622 B2 | 5/2014 | Moon et al. |
| 2010/0207185 A1 | 8/2010 | Lee et al. |
| 2011/0147824 A1* | 6/2011 | Son .................... G11C 16/0483 257/324 |
| 2012/0267699 A1 | 10/2012 | Kiyotoshi |
| 2012/0295409 A1 | 11/2012 | Yun et al. |
| 2013/0134492 A1* | 5/2013 | Yang ................ H01L 27/11582 257/314 |
| 2013/0154055 A1 | 6/2013 | Park et al. |
| 2013/0248965 A1 | 9/2013 | Nakai et al. |
| 2013/0264626 A1 | 10/2013 | Sawa |
| 2013/0334593 A1 | 12/2013 | Seol et al. |
| 2014/0045311 A1 | 2/2014 | Doo |
| 2014/0097484 A1 | 4/2014 | Seol et al. |

FOREIGN PATENT DOCUMENTS

| | | |
|---|---|---|
| KR | 1020100093348 | 8/2010 |
| KR | 1020130072671 | 7/2013 |

\* cited by examiner

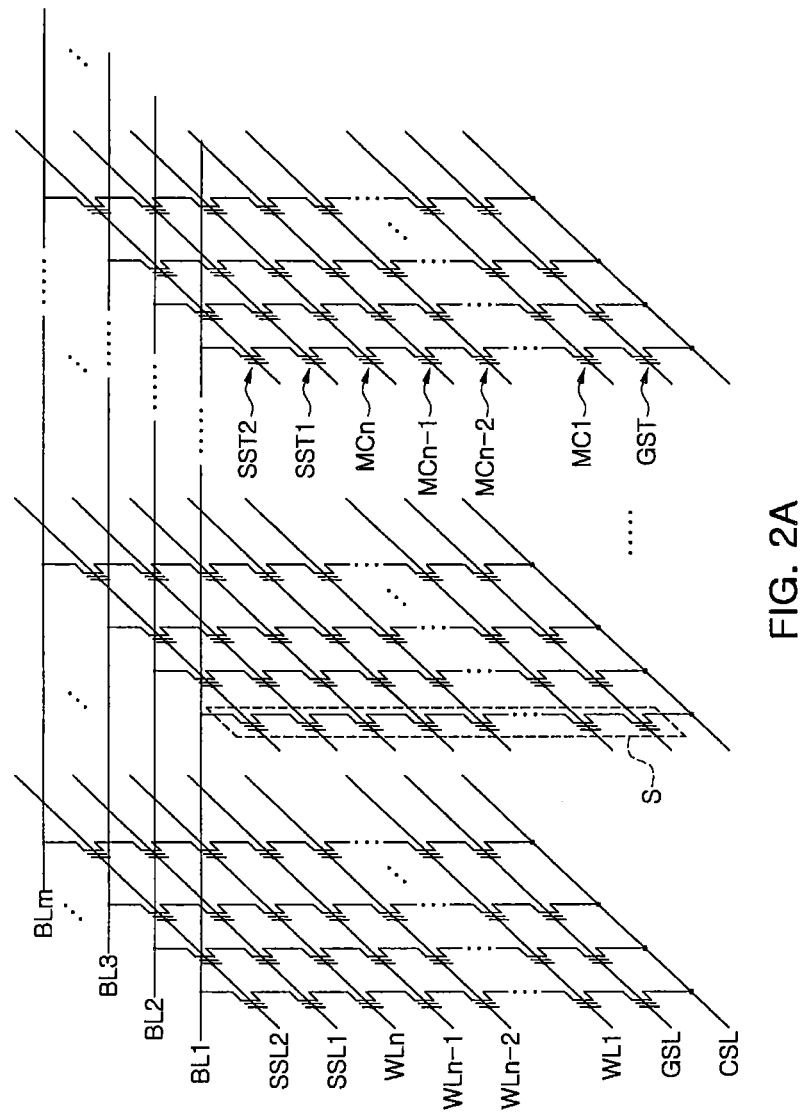

MEMORY DEVICES AND METHODS OF FABRICATING THE SAME

CROSS-REFERENCE TO RELATED APPLICATION

This application claims priority from Korean Patent Application No. 10-2014-0130121 filed on Sep. 29, 2014, with the Korean Intellectual Property Office, the disclosure of which is incorporated herein by reference in its entirety.

BACKGROUND

The present inventive concepts relate to memory devices and methods of fabricating the same.

Electronic products have been gradually reduced in overall size, despite requirements to process larger amount of data. Accordingly, it may be advantageous to increase the degree of integration of semiconductor devices used in such electronic products. As methods for increasing the degree of integration of such semiconductor devices, research into memory devices in which cell regions and/or peripheral circuit regions are formed in vertically different regions has been conducted.

SUMMARY

Embodiments of the present inventive concepts may provide a memory device in which an aspect ratio in the one unit cell region is lowered and misalignment of a contact connected to a channel area is reduced or minimized by retaining a portion of a sacrificial layer for forming a gate electrode layer and thereby dividing a word line, and methods of fabricating the same.

According to some embodiments, a memory device includes a substrate having common source regions thereon, common source lines extending along a surface of the substrate and contacting the common source regions, respectively, and channel structures extending away from the surface of the substrate between the common source lines. The common source lines define a unit cell of the memory device therebetween. The memory device further includes an electrode stack structure having interlayer insulating layers and conductive electrode layers that are alternately stacked along sidewalls of the channel structures. The conductive electrode layers define respective gates of selection transistors and memory cell transistors of the memory device. An isolation insulating layer, which includes a portion of a sacrificial layer, is disposed between adjacent ones of the interlayer insulating layers in the stack structure. The isolation insulating layer divides at least one of the conductive electrode layers in the stack structure into electrically separate portions.

In some embodiments, the at least one of the conductive electrode layers, which is divided by the isolation insulating layer, may define a gate of at least one of the selection transistors of the memory device.

In some embodiments, the portion of the sacrificial layer defining the isolation insulating layer may include a material having a lower etching rate than other sacrificial layers used in the stack structure.

In some embodiments, the at least one of the selection transistors may be a ground selection transistor, and a gate isolation layer may electrically separate one or more of the conductive electrode layers in the stack structure. The one or more of the conductive electrode layers may define respective gates of one or more string selection transistors. The gate isolation layer may include a same material as the interlayer insulating layers in the stack structure.

In some embodiments, upper and lower ones of the interlayer insulating layers in the stack structure may have different thicknesses than ones of the interlayer insulating layers therebetween in the stack structure.

According to an aspect of the present inventive concepts, a memory device includes a channel area extending in a direction perpendicular to an upper surface of a substrate, a plurality of gate electrode layers stacked on the substrate adjacent to the channel area and providing at least one ground select transistor, at least one string select transistor, and a plurality of memory cell transistors, a plurality of isolation areas extending in the direction perpendicular to the upper surface of the substrate and dividing the plurality of gate electrode layers by a unit cell region, and at least one isolation insulating layer dividing each of gate electrode layers providing the at least one ground select transistor and the at least one string select transistor among the plurality of gate electrode layers in the unit cell region.

In some exemplary embodiments, the at least one isolation insulating layer may divide each of the plurality of gate electrode layers providing the at least one ground select transistor, the at least one string select transistor, and the plurality of memory cell transistors.

In other exemplary embodiments, each of the plurality of gate electrode layers providing the plurality of memory cell transistors may be provided as a single gate electrode layer in the unit cell region.

In other exemplary embodiments, the at least one isolation insulating layer may be parallel to the upper surface of the substrate.

In other exemplary embodiments, the memory device may further include a gate isolation layer dividing the gate electrode layers included in at least a portion of the at least one string select transistor and the plurality of memory cell transistors.

In other exemplary embodiments, the at least one isolation insulating layer may only divide the gate electrode layer included in the at least one ground select transistor.

In other exemplary embodiments, the gate isolation layer may include silicon oxide.

In other exemplary embodiments, the at least one isolation insulating layer may include silicon nitride.

In other exemplary embodiments, each of the gate electrode layers divided by the at least one isolation insulating layer may be adjacent to different channel areas from each other.

According to another aspect of the present inventive concepts, a memory device includes a substrate, a cell region including at least one ground select transistor, at least one string select transistor, and a plurality of memory cell transistors, stacked on the substrate, a plurality of isolation areas dividing the cell region into a plurality of unit cell regions, and at least one isolation insulating layer disposed parallel to an upper surface of the substrate, and dividing each of gate electrode layers providing the at least one ground select transistor in each of the plurality of unit cell regions.

In some exemplary embodiments, the at least one isolation insulating layer may divide each of gate electrodes included in the at least one ground select transistor, the at least one string select transistor, and the plurality of memory cell transistors.

In other exemplary embodiments, the gate electrode layers included in the plurality of memory cell transistors may be provided as a single gate electrode layer in the plurality of unit cell regions.

In other exemplary embodiments, the memory device may further include a gate isolation layer dividing each of the gate electrode layers included in the at least one string select transistor.

In other exemplary embodiments, each of the gate electrode layers included in the at least one ground select transistor may be divided by the at least one isolation insulating layer.

In other exemplary embodiments, the at least one isolation insulating layer may include silicon nitride.

BRIEF DESCRIPTION OF DRAWINGS

The above and other aspects, features and other advantages of the present inventive concepts will be more clearly understood from the following detailed description taken in conjunction with the accompanying drawings, in which:

FIGS. 2A to 2C are equivalent circuit diagrams illustrating a memory cell array of memory devices according to some embodiments of the present inventive concepts;

DETAILED DESCRIPTION

Figure 1:
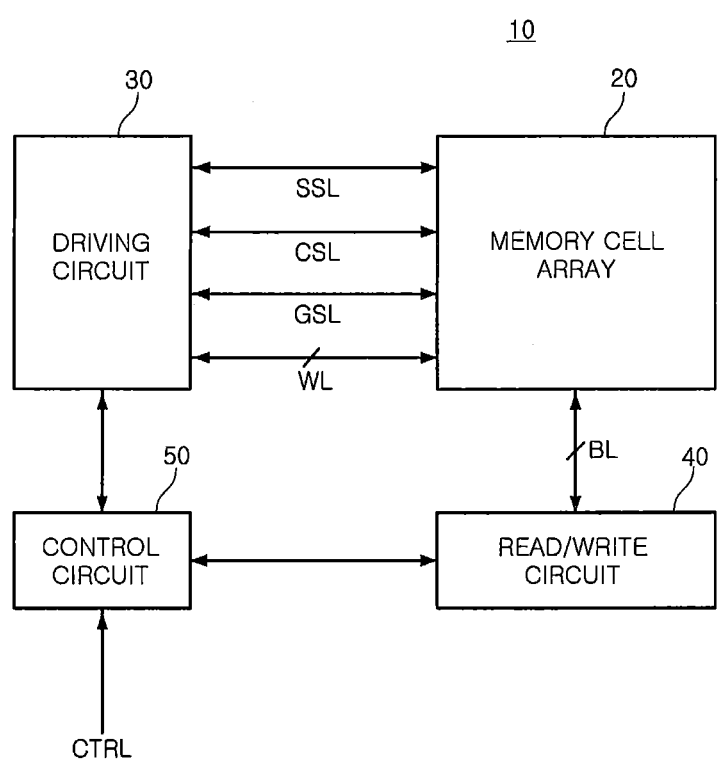
FIG. 1 is a schematic block diagram of memory devices according to some embodiments of the present inventive concepts.

Hereinafter, embodiments of the present inventive concepts will be described in detail with reference to the accompanying drawings. The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Variations from the shapes of the illustrations as a result, for example, of manufacturing techniques and/or tolerances, are to be expected. Thus, embodiments of the inventive concepts should not be construed as being limited to the particular shapes of regions illustrated herein but are to include deviations in shapes that result, for example, from manufacturing.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

FIG. 1 is a schematic block diagram of a memory device according to some embodiments of the present inventive concepts.

Referring to FIG. 1, a memory device 10 according to some embodiments of the present inventive concepts may include a memory cell array 20, a driving circuit 30, a read/write circuit 40, and a control circuit 50.

The memory cell array 20 may include a plurality of memory cells, and the plurality of memory cells may be arranged in a plurality of rows and columns. The plurality of memory cells included in the memory cell array 20 may be connected to the driving circuit 30 through a word line WL, a common source line CSL, a string select line SSL, a ground select line GSL, or the like, and to the read/write circuit 40 through a bit line BL. In some embodiments, the plurality of memory cells arranged in the same row may be connected to the same word line WL, and the plurality of memory cells arranged in the same column may be connected to the bit line BL.

The plurality of memory cells included in the memory cell array 20 may be divided into a plurality of memory blocks. Each memory block may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. In some embodiments, the driving circuit 30 may receive address information from an external device, decode the received address information, and select at least a portion of the word line WL, common source line CSL, string select line SSL, and ground select line GSL connected to the memory cell array. The driving circuit 30 may include a driving circuit for each of the word line WL, the string select line SSL, and the common source line CSL.

The read/write circuit 40 may select at least a portion of the bit lines BL connected to the memory cell array 20 according to a command received from the control circuit 50. The read/write circuit 40 may read data stored in a memory cell connected to the selected portion of the bit lines BL, or write data to a memory cell connected to the selected portion of the bit line BL. The read/write circuit 40 may include circuits, such as page buffers, input/output buffers, data latches, and/or the like, in order to perform such an operation.

The control circuit 50 may control an operation of the driving circuit 30 and the read/write circuit 40 in response to a control signal CTRL transmitted from an external device. When data stored in the memory cell array 20 is read, the control circuit 50 may control an operation of the driving circuit 30 so as to supply a voltage for the reading operation to a word line WL storing data to be read. When the voltage for the reading operation is supplied to the word line WL, the control circuit 50 may control the read/write circuit 40 to read the data stored in a memory cell connected to the word line WL to which the voltage for the reading operation is supplied.

Meanwhile, when data is written in memory cell array 20, the control circuit 50 may control an operation of the driving circuit 30 to supply a voltage for a writing operation to the word line WL. When the voltage for the writing operation is supplied to the word line WL, the control circuit 50 may control the read/write circuit 40 to write the data in a memory cell connected to the word line WL to which the voltage for the writing operation is supplied.

Figure 2B:
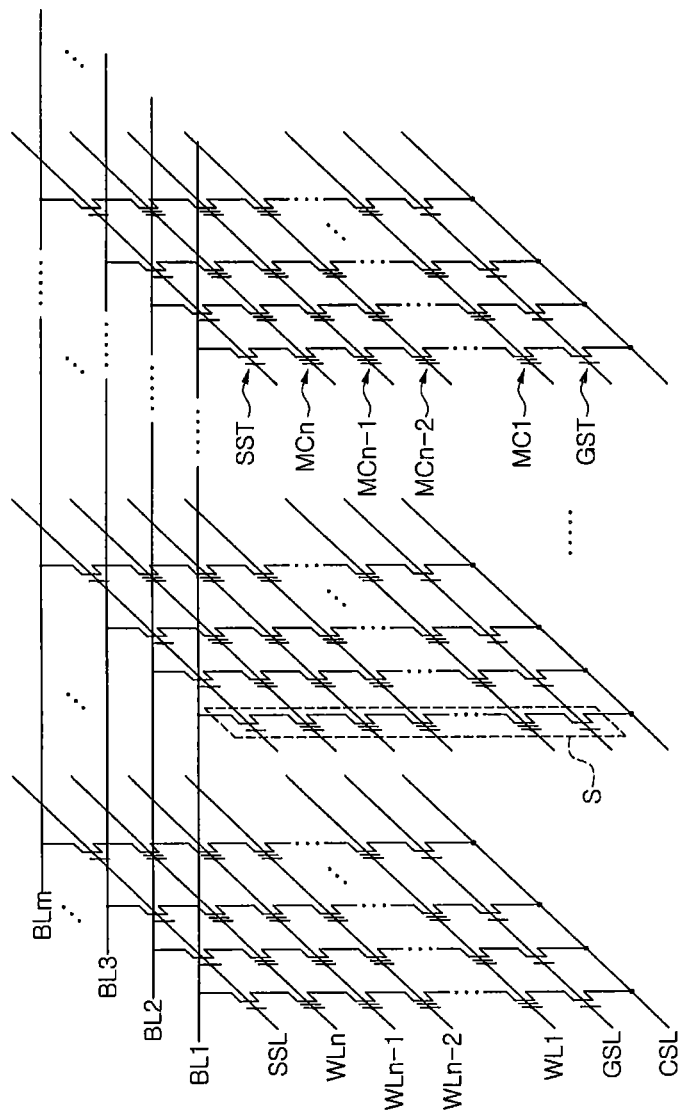
Figure 2C:
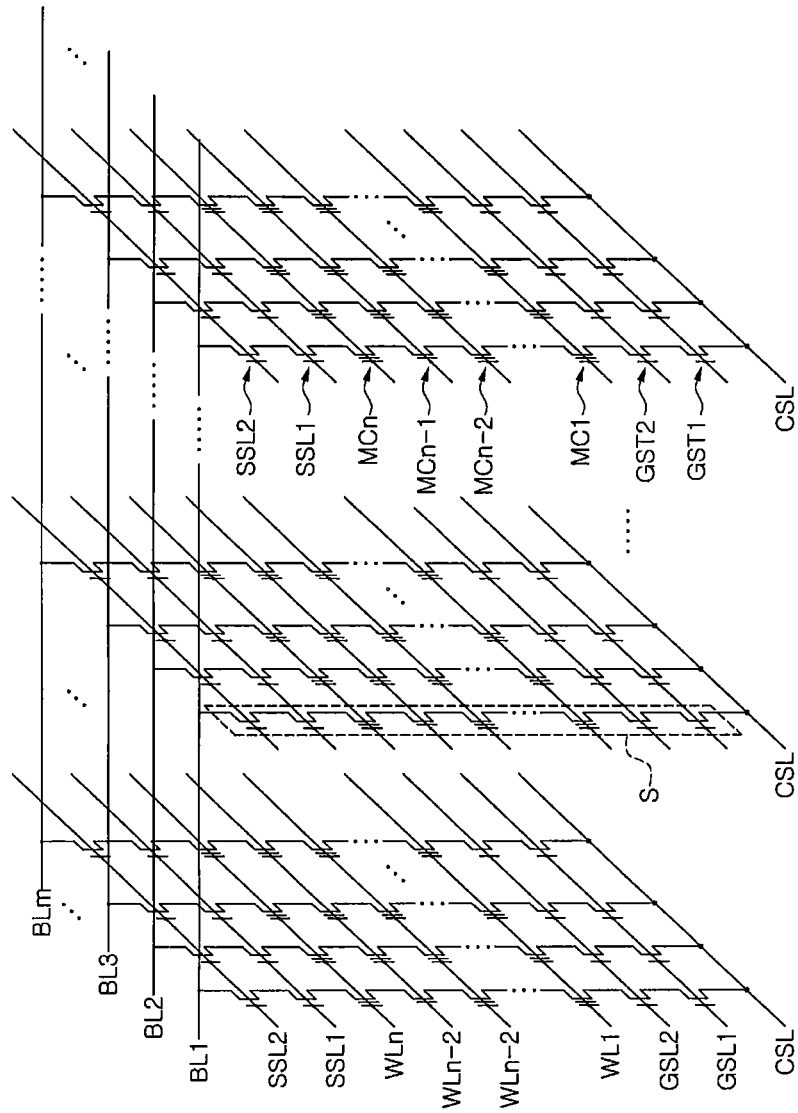

FIGS. 2A to 2C are equivalent circuit diagrams illustrating a memory cell array of a memory device according to some embodiments of the present inventive concepts.

First, referring to FIG. 2A, a memory cell array according to some embodiments of the present inventive concepts may include a plurality of memory cell strings S. Each of the memory cell strings S may include n memory cell transistors MC1 to MCn connected to each other in series, and a ground select transistor GST and string select transistors SST1 and SST2 respectively connected to both end portions of the memory cell transistors MC1 to MCn in series.

The n memory cell transistors MC1 to MCn connected to each other in series may be respectively connected to word lines WL1 to WLn for selecting at least a portion of the memory cell transistors MC1 to MCn.

A gate terminal of the ground select transistor GST may be connected to the ground select line GSL, and a source terminal of the ground select transistor GST may be connected to the common source line CSL. Meanwhile, gate terminals of the string select transistors SST1 and SST2 may be respectively connected to string select lines SSL1 and SSL2, and a source terminal of the first string select transistor SST1 may be connected to a drain terminal of an nth memory cell transistor MCn. Although one ground select transistor GST and two string select transistors SST1 and SST2 are connected to the n memory cell transistors MC1 to MCn connected to each other in series in FIG. 2A, the number of ground select transistor GST or string select transistors SST1 and SST2 may be changed. In addition, the ground select transistor GST or the string select transistors SST1 and SST2 may have a different structure from the memory cell transistors MC1 to MCn.

For example, referring to an equivalent circuit diagram of a memory cell array illustrated in FIG. 2B, one ground select transistor GST and one string select transistor SST may be connected to one memory cell string S. In addition, referring to FIG. 2C, two or more ground select transistors GST1 and GST2 and string select transistors SST1 and SST2 may be included in one memory cell string S, the ground select transistors GST1 and GST2 and the string select transistors SST1 and SST2 may not include a floating gate, unlike the memory cell transistors MC1 to MCn.

A drain terminal of the second string select transistor SST2 disposed at one end portion of the memory cell string S may be connected to bit lines BL1 to BLm. When a signal is applied to a gate terminal of the second string select transistor SST2 through the string select line SSL, a data reading operation or a data writing operation may be performed in such a manner that the signal applied through the bit lines BL1 to BLm is transmitted to the n memory cell devices MC1 to MCn connected to each other. In addition, an erase operation in which charges stored in the n memory cell transistors MC1 to MCn are discharged or fully removed, may be performed by applying a signal to a gate terminal of a gate select transistor GST whose source terminal is connected to the common source line CSL through a gate select line GSL.

Figure 3:
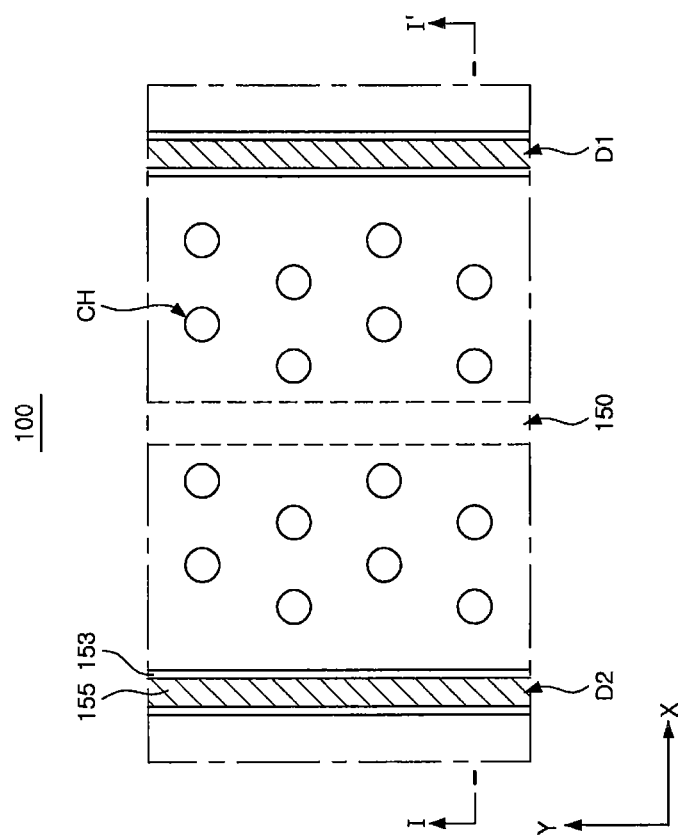
FIG. 3 is a schematic plan view of memory devices according to some embodiments of the present inventive concepts.

FIG. 3 is a schematic plan view of a memory device according to some embodiments of the present inventive concepts.

Referring to FIG. 3, a schematic plan view of some components of a memory cell region included in the memory device 100 according to some embodiments of the present inventive concepts is illustrated. The memory device 100 may include a plurality of isolation areas D1 and D2, which divide a memory cell region into a plurality of unit cell regions UC, and a plurality of channel areas CH (also referred to herein as channel structures) arranged in each unit cell region UC.

Each channel area CH may protrude or extend in a direction perpendicular to an x-y plane, and a plurality of gate electrode layers may be stacked in a direction perpendicular to the x-y plane around the plurality of channel areas CH so as to be adjacent to the channel areas CH. The plurality of isolation areas D1 and D2 may divide the plurality of gate electrode layers that are stacked adjacent to the channel areas CH to define the plurality of unit cell regions UC, and may extend in a direction, for example, in a y-axis direction as illustrated in FIG. 3.

The plurality of gate electrode layers stacked adjacent to the channel areas CH may extend in a direction parallel to the plurality of isolation areas D1 and D2, for example, in the y-axis direction in FIG. 3, to be connected to circuit devices in a peripheral circuit region. Meanwhile, the channel areas CH may pass through the plurality of gate electrode layers, and a plurality (for example, four) channel areas CH may be arranged in a line in an x-axis in one unit cell region UC, and in a zigzag form in the y-axis. That is, channel areas CH adjacent to each other may be arranged in a staggered relation to each other. In the memory device 100, a memory cell string may be configured around each channel area CH. However, the arrangement of the channel areas CH may vary according to embodiments of the present inventive concepts, and the number of the channel areas CH arranged in a direction is not limited to that illustrated in the drawings.

The memory device 100 according to some embodiments of the present inventive concepts may include an isolation insulating layer 150 disposed in at least a portion of the gate electrode layers. The isolation insulating layer 150 may divide the at least a portion of the gate electrode layers. Referring to FIG. 3, the isolation insulating layer 150 may be disposed in the center in a direction, that is, the x-axis direction in FIG. 3, in each unit cell region UC, and the same number of channel areas CH may be arranged in each of left and right sides with respect to the isolation insulating layer 150.

The isolation insulating layer 150 may be disposed in at least one of the gate electrode layers included in a string select transistor and/or a ground select transistor. Accordingly, in one unit cell region UC, the memory cell transistors formed by the gate electrode layers and channel areas CH disposed in the left side (or to the left) of the isolation insulating layer 150 in the x-axis direction, and the memory cell transistors formed by the gate electrode layers and channel areas CH disposed in the right side (or to the right) of the isolation insulating layer 150 in the x-axis direction may be independently addressed to perform reading and/or writing operations.

Figure 4:
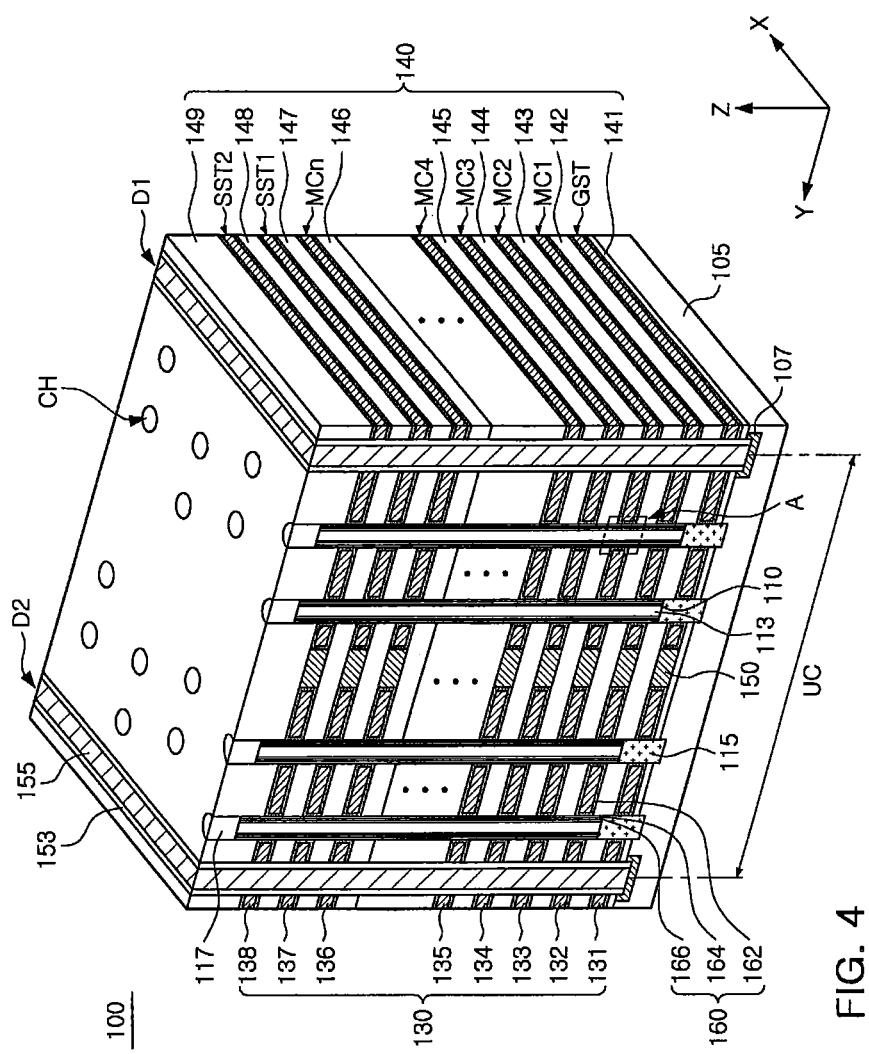
FIGS. 4 to 6 are perspective views illustrating memory devices according to exemplary embodiments of the present inventive concepts.
Figure 5:
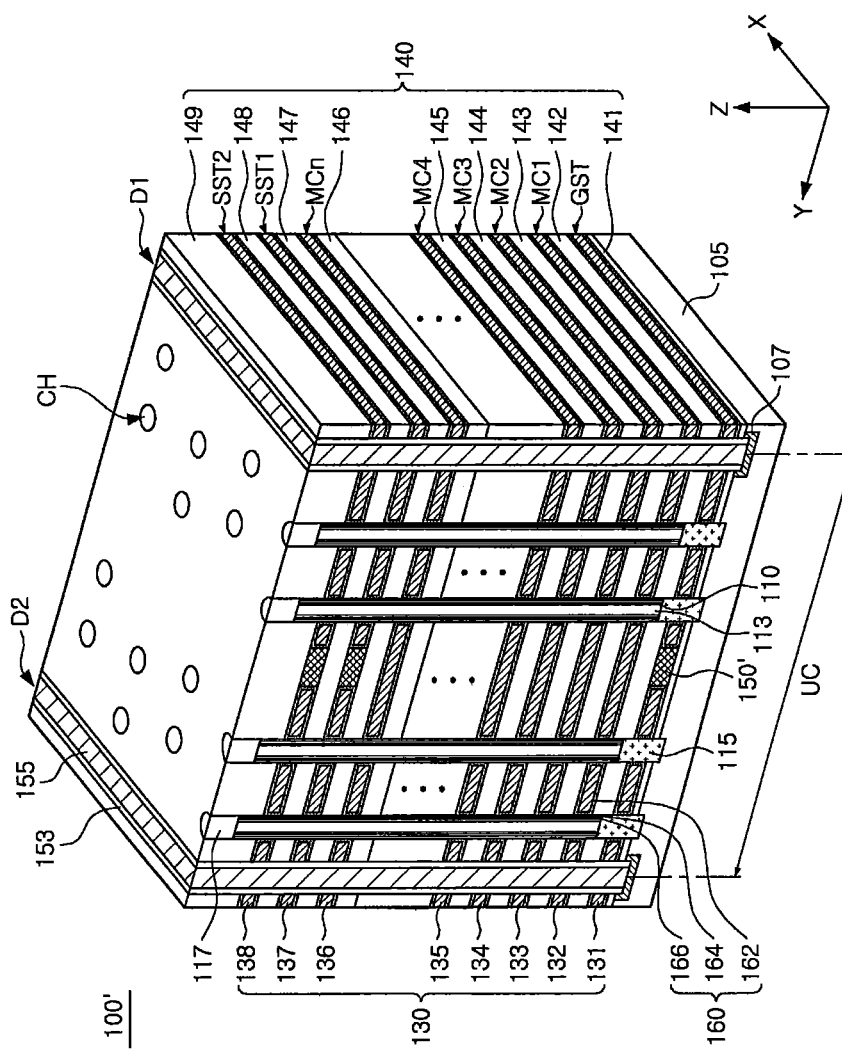
Figure 6:
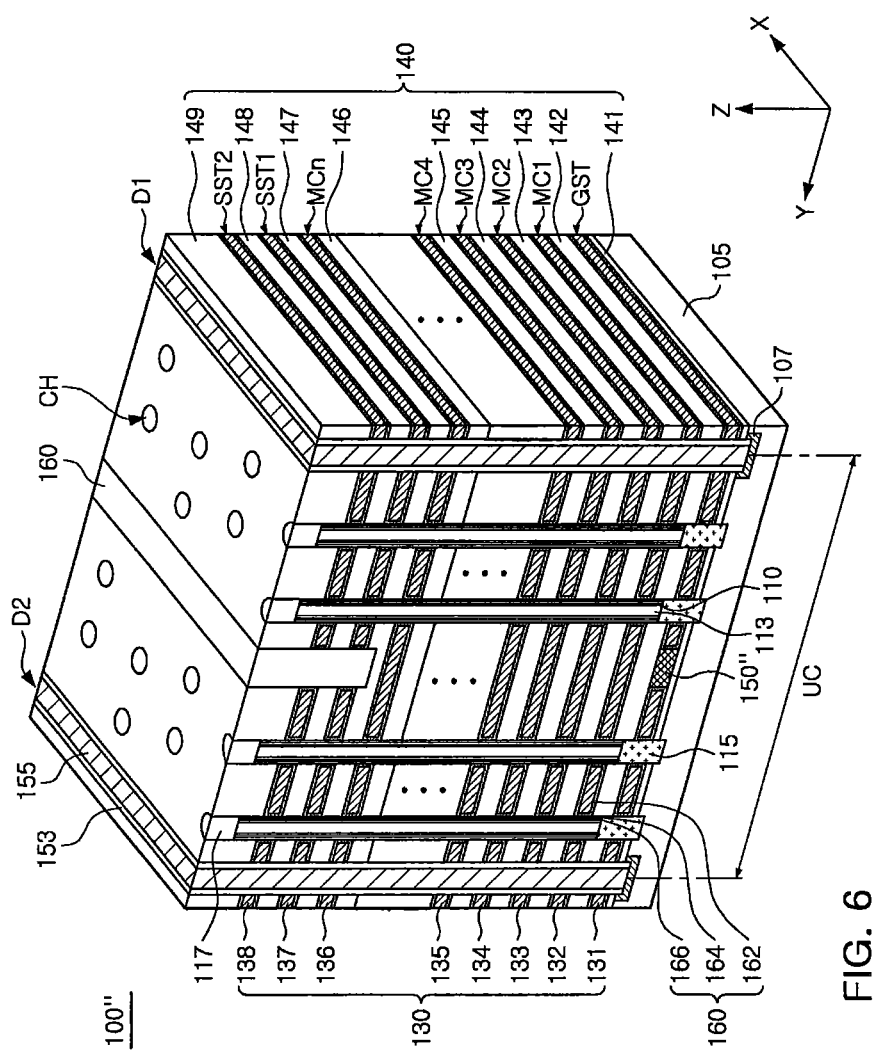

FIGS. 4 to 6 are perspective views illustrating memory devices according to exemplary embodiments of the present inventive concepts.

FIG. 4 is a perspective view illustrating a portion of a memory device 100 according to some embodiments of the present inventive concepts. For example, FIG. 4 may include a region taken along line I-I' in the plan view of the memory device 100 in FIG. 3. The memory device 100 may include a substrate 105, channel areas CH disposed perpendicular to an upper surface of the substrate 105, a plurality of gate electrode layers 130 (including layers 131 to 138) stacked on the substrate 105 to be adjacent to the channel areas CH, and one or more isolation insulating layers 150 disposed in at least a portion of the gate electrode layers 130.

The channel areas CH may be disposed on the upper surface of the substrate 105 to extend in a direction (a z-axis direction) perpendicular to the upper surface of the substrate 105. Annular channel layers 110 surrounding embedded insulating layers 113 may be formed in the channel areas CH. In some embodiments, the channel layers 110 may have a columnar shape, such as cylindrical or prismatic shape, with no embedded insulating layer 113. In addition, the channel areas CH may have tapered sidewalls toward the substrate 105. The channel layers 110, any embedded insulating layers 113, and/or other layers formed in the channel areas CH are thus included in the channel structures described herein.

The channel areas CH may be arranged to be spaced apart from each other in an x-axis direction and a y-axis direction. However, the number and arrangement of the channel areas CH may be changed according to various embodiments. For example, the channel areas CH may be arranged in a zigzag form in at least one direction. In addition, the arrangement of the channel areas CH adjacent to each other with the isolation insulating layers 150 therebetween may be symmetrical as illustrated in FIG. 4, but is not limited thereto.

Lower surfaces of the channel layers 110 may be electrically connected to the substrate 105 through epitaxial layers 115. The channel layers 110 may include a semiconductor material, such as polysilicon or single crystalline silicon, and the semiconductor material may be an undoped material or a material including p-type or n-type impurities. The epitaxial layers 115 may be a layer grown by a selective epitaxial growth (SEG) process.

The plurality of gate electrode layers 130 and a plurality of interlayer insulating layers 140 (including layers 141 to 149) may be alternately stacked in the z-axis direction to define an electrode stack structure. Each gate electrode layer 130 may be disposed to be adjacent to at least one channel layer 110, and may provide gate electrodes of ground select transistors GST, a plurality of memory cell transistors MC1 to MCn, and string select transistors SST1 and SST2. The gate electrode layers 130 may extend to form word lines WL1 to WLn, and be commonly connected to a predetermined unit of adjacent memory cell strings arranged in the x-axis direction and the y-axis direction. In some embodiments, the total number of the gate electrode layers 131 to 136 that define the memory cell transistors MC1 to MCn may be $2^a$ (where a is a non-negative integer or natural number).

A gate electrode layer 131 of the ground select transistors GST may be connected to a ground select line GSL. Gate electrode layers 137 and 138 of the string select transistors SST1 and SST2 may be connected to a string select line SSL. In particular, the gate electrode layers 137 and 138 of the string select transistors SST1 and SST2 may be separated between adjacent memory cell strings to be connected to different string select lines SSL. In some embodiments of the present inventive concepts, a plurality of string select transistors SST1 and SST2 may be separated by the isolation insulating layer 150. In FIG. 4, two gate electrode layers 137 and 138 of the string select transistors SST1 and SST2, and one gate electrode layer 131 of the ground select transistors GST are illustrated, but are not limited thereto. Meanwhile, the gate electrode layers 131, 137, and 138 of the ground select transistors GST and the string select transistors SST1 and SST2 may have different structures from the gate electrode layers 132 to 136 of the memory cell transistors MC1 to MCn.

The plurality of gate electrode layers 130 may include polysilicon and/or a metal silicide material. The metal silicide material may be a silicide material of a metal selected from Co, Ni, Hf, Pt, W, and/or Ti. In some embodiments, the plurality of gate electrode layers 130 may include a metal material, for example, tungsten (W). In addition, the plurality of gate electrode layers 130 may further include a diffusion barrier, and the diffusion barrier may include, for example, tungsten nitride (WN), tantalum nitride (TaN), and/or titanium nitride (TiN).

The plurality of gate electrode layers 130 and the plurality of interlayer insulating layers 140 may be alternately stacked. The plurality of interlayer insulating layers 140 may be arranged to be spaced apart from each other in the z-axis direction and may extend in the y-axis direction, similarly to the plurality of gate electrode layers 130. The plurality of interlayer insulating layers 140 may include an insulating material, such as silicon oxide or silicon nitride.

Gate dielectric layers 160 may be disposed between the plurality of gate electrode layers 130 and the channel layers 110. Each of the gate dielectric layers 160 may include a blocking layer 162, a charge storage layer 164, and a tunneling layer 166 sequentially stacked between each channel layer 110 and each gate electrode layer 130. This will be described in detail with reference to FIG. 7, an enlarged view of the region A of FIG. 3.

The blocking layer 162 may include a high-k dielectric material. Here, the high-k dielectric material may refer to a dielectric material having a higher dielectric constant than silicon oxide. The tunneling layer 166 may transmit charges to the charge storage layer 164 in an F-N tunneling method. The tunneling layer 166 may include, for example, silicon oxide. The charge storage layer 164 may be a charge trapping layer or a floating gate conductive layer. For example, the charge storage layer 164 may include a dielectric material, quantum dots, and/or nanocrystals. Here, the quantum dots or nanocrystals may be formed of a conductive material, for example, fine particles of a metal or a semiconductor material.

In an upper end portion of the memory device 100 in the z-axis direction, drain areas 117 may be disposed on or to cover upper surfaces of the embedded insulating layers 113 and to be electrically connected to the channel layers 110. In some embodiments, the drain areas 117 may include doped polysilicon. The drain areas 117 may function as drain areas of the string select transistors SST1 and SST2.

Meanwhile, in a lower end portion of the memory device 100 in the z-axis direction, source areas or regions 107 of the ground select transistors GST arranged in the x-axis direction may be disposed. The source areas 107 may extend in the x-axis direction to be adjacent to the upper surface of the substrate 105, and be arranged to be spaced apart by a predetermined interval in the y-axis direction. On the source areas 107, isolation areas D1 and D2 dividing the memory device 100 into unit cell regions UC may be disposed. Each of the isolation areas D1 and D2 may include an isolation insulating layer 153 electrically isolating the gate electrode layers 130 included in each unit cell region UC, and a common source line 155 electrically connected to the source areas 107. The common source line 155 may include tungsten (W), aluminum (Al), copper (Cu), and/or the like.

When the source areas 107 have an opposite conductivity type to the substrate 105, the source areas 107 may function as source areas of adjacent ground select transistors GST, and may be connected to the common source line CSL illustrated in FIG. 2A. When the source areas 107 have the same conductivity type as the second substrate 105, the source areas 107 may function as a contact electrode of a pocket p-well configured to perform an erase operation by a block. In this case, since a high voltage is applied to the substrate 105 through the contact electrode of the pocket p-well, data stored in all memory cell transistors MC1 to MCn in the block of the substrate 105 may be erased.

Meanwhile, each gate electrode layer 130 may be divided by the isolation insulating layer 150 in one unit cell region UC. Referring to FIG. 4, an isolation insulating layer 150 may be disposed in the x-axis direction in each gate electrode layer 130. Each gate electrode layer 130 may be divided in the y-axis direction in the unit cell region UC by the isolation insulating layer 150.

Since the plurality of gate electrode layers 130 are separated by forming the isolation insulating layer 150 in the unit cell region UC, memory cell strings formed by the gate electrode layers 130 and channel areas CH disposed adjacent to the first isolation area D1 in the y-axis direction, and the memory cell strings formed by the gate electrode layers 130 and channel areas CH disposed adjacent to the second isolation area D2 in the y-axis direction may be independently operated or addressed. Accordingly, an aspect ratio defined by a width (a length in the y-axis direction of FIG. 4) and height (a stack thickness in the z-axis direction of FIG. 4) of each unit cell region UC may be reduced.

When the height of the memory device 100 increases since the number of the plurality of gate electrode layers 130 and the interlayer insulating layers 140 increase, the aspect ratio of each unit cell region UC may increase. As the aspect ratio of each unit cell region UC increases, deformation of the channel areas CH may occur due to a stress generated in a process of injecting a conductive material such as tungsten to form the plurality of gate electrode layers 130. When the deformation of the channel areas CH occurs, a misalignment may be generated in a process of forming contact holes on the drain areas 117 disposed on the channel layers 110.

According to some embodiments of the present inventive concepts, since an isolation insulating layer 150 is formed in one unit cell region UC, the aspect ratio in each unit cell region UC may be reduced, and thus the deformation of the channel areas CH due to a stress generated in the process of forming the gate electrode layers 130. Accordingly, a manufacturing process may become easier, and a manufacturing yield may be improved.

Figure 7:
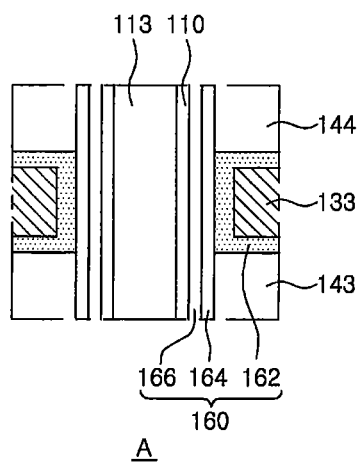
FIG. 7 is a partial cross-sectional view illustrating a gate dielectric layer and a channel area according to some embodiments of the present inventive concepts.

Next, the gate dielectric layers 160, the channel areas CH, and the gate electrode layers 130 of the memory device 100 in FIG. 4 are described with reference to FIG. 7. FIG. 7 is a partially enlarged view of the region A of FIG. 4.

Referring to FIG. 7, a gate electrode layer 133, insulating layers 143 and 144, a gate dielectric layer 160, and channel areas CH including an embedded insulating layer 113 and a channel layer 110 are illustrated. The channel layer 110 may have an annular shape, and the embedded insulating layer 113 may be disposed thereon. The gate dielectric layer 160 may have a structure including a blocking layer 162, a charge storage layer 164, and a tunneling layer 166 sequentially stacked from the gate electrode layer 133 to the channel layer 110. Relative thicknesses of the layers that define the gate dielectric layer 160 may not be limited to those illustrated in FIG. 7, and may vary.

The blocking layer 162 may include silicon oxide ($SiO_2$), silicon nitride ($Si_3N_4$), silicon oxynitride (SiON), and/or a high-k dielectric material. The high-k dielectric material may include one or more of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). Although the blocking layer 162 is illustrated as including one layer in FIG. 7, the blocking layer 162 may include a high-k dielectric layer and a low-k dielectric layer. In this case, the low-k dielectric layer may be disposed to be in contact with the charge storage layer 164. The high-k dielectric layer may be formed of a material having a higher dielectric constant than the tunneling layer 166, and the low-k dielectric layer may be formed of a material having a relatively lower dielectric constant than the high-k dielectric layer. Since the low-k dielectric layer is disposed next to the high-k dielectric layer, an energy band, for example, a barrier height may be controlled so as to improve characteristics of a nonvolatile memory device, for example, erase characteristics.

The charge storage layer 164 may be a charge trapping layer or a floating gate conductive layer. When the charge storage layer 164 is a floating gate, it may be formed, for example, by depositing polysilicon using a low pressure chemical vapor deposition (LPCVD). When the charge storage layer 164 is a charge trapping layer, it may include silicon oxide (SiO$_2$), silicon nitride (Si$_3$N$_4$), silicon oxynitride (SiON), hafnium oxide (HfO$_2$), zirconium oxide (ZrO$_2$), tantalum oxide (Ta$_2$O$_3$), titanium oxide (TiO$_2$), hafnium aluminum oxide (HfAl$_x$O$_y$), hafnium tantalum oxide (HfTa$_x$O$_y$), hafnium silicon oxide (HfSi$_x$O$_y$), aluminum nitride (Al$_x$N$_y$), and/or aluminum gallium nitride (AlGa$_x$N$_y$).

The tunneling layer 166 may include silicon oxide (SiO$_2$), silicon nitride (Si$_3$N$_4$), silicon oxynitride (SiON), hafnium oxide (HfO$_2$), hafnium silicon oxide (HfSi$_x$O$_y$), aluminum oxide (Al$_2$O$_3$), and/or zirconium oxide (ZrO$_2$).

Next, FIG. 5 is a perspective view illustrating a part of a memory device 100' according to some embodiments of the present inventive concepts. The memory device 100' according some embodiments illustrated in FIG. 5 include a substrate 105, channel areas CH disposed perpendicular to an upper surface of the substrate 105, a plurality of gate electrode layers 130 (including layers 131 to 138) stacked on the substrate 105 to be adjacent to the channel areas CH, and one or more isolation insulating layers 150' disposed in at least a portion of the gate electrode layers 130.

In the memory device 100' according some embodiments illustrated in FIG. 5, the channel areas CH may include channel layers 110 and embedded insulating layers 113 filling the channel layers 110. Lower surfaces of the channel layers 110 may be electrically connected to the substrate 105 through epitaxial layers 115. The channel layers 110 may include a semiconductor material, such as polysilicon or single crystalline silicon.

The plurality of gate electrode layers 130 and a plurality of insulating layers 140 (including layers 141 to 149) may be alternately stacked on the substrate 105, and disposed to be adjacent to one or more channel areas CH. The plurality of gate electrode layers 130 and the one or more channel areas CH may provide ground select transistors GST, string select transistors SST1 and SST2, and memory cell transistors MC1 to MCn. Gate dielectric layers 160 may be disposed between the gate electrode layers 130 and the channel layers 110 of the channel areas CH. In some embodiments, each of the gate dielectric layers 160 may include a blocking layer 162, a charge storage layer 164, and a tunneling layer 166.

Referring to FIG. 5, each of the gate electrode layers 131, 137, and 138 included in the ground select transistors GST and the string select transistors SST1 and SST2 may be divided by an isolation insulating layer 150' in one unit cell region UC. Each of the gate electrode layers 131, 137, and 138 divided by the isolation insulating layer 150' may be disposed to be adjacent to a different channel area CH.

Accordingly, the memory cell transistors MC1 to MCn respectively provided by the gate electrode layers 132 to 136 in one unit cell region UC, which are not divided by the isolation insulating layer 150', may be independently operated or addressed in a left side and a right side of the isolation insulating layer 150' in the y-axis direction. Drain areas 117 of the channel areas CH adjacent to each of the gate electrode layers 131, 137, and 138 divided by the isolation insulating layer 150' may be connected to different bit lines BL1 to BLn, and a plurality of memory cell strings S that can be independently operated at the left side and at the right side of the isolation insulating layer 150' in the y-axis direction may be defined.

Next, FIG. 6 is a perspective view illustrating a part of a memory device 100" according to some embodiments of the present inventive concepts. The memory device 100" according some embodiments illustrated in FIG. 6 include a substrate 105, channel areas CH disposed perpendicular to an upper surface of the substrate 105, a plurality of gate electrode layers 130 (including layers 131 to 138) stacked on the substrate 105 to be adjacent to the channel areas CH, and one or more isolation insulating layers 150" disposed in at least a portion of the gate electrode layers 130.

In the memory device 100" according some embodiments illustrated in FIG. 6, the channel areas CH may include channel layers 110 and buried insulating layers 113 filling the channel layers 110. Lower surfaces of the channel layers 110 may be electrically connected to the substrate 105 through epitaxial layers 115. Meanwhile, the plurality of gate electrode layers 130 and a plurality of insulating layers 140 (including layers 141 to 149) may be alternately stacked on the substrate 105, and disposed to be adjacent to one or more channel areas CH. The plurality of gate electrode layers 130 and the one or more channel areas CH may provide ground select transistors GST, string select transistors SST1 and SST2, and memory cell transistors MC1 to MCn. Gate dielectric layers 160 may be disposed between the gate electrode layers 130 and the channel layers 110 of the channel areas CH.

Referring to FIG. 6, an isolation insulating layer 150" may divide the gate electrode layer 131 included in the ground select transistors GST. That is, the isolation insulating layer 150" may be disposed only in the lowermost gate electrode layer 131 in a direction of stack (the z-axis direction of FIG. 6). In order to independently operate or address memory cell strings S disposed in a left side and a right side of the isolation insulating layer 150" in one unit cell region UC, similar to the memory devices 100 and 100' respectively illustrated in FIG. 4 and FIG. 5, the gate electrode layers 137 and 138 respectively included the string select transistors SST1 and SST2 should also be divided.

In some embodiments illustrated in FIG. 6, the gate electrode layers 137 and 138 included in the string select transistors SST1 and SST2 may be divided not by the isolation insulating layer 150", but by an additional gate isolation layer 160. The gate isolation layer 160 may be formed after alternately stacking a plurality of sacrificial layers for forming the plurality of gate electrode layers 130 and the plurality of insulating layers 140 (including layers 141 to 149) in a manufacturing process, and may include, for example, silicon oxide. Since the gate isolation layer 160 is formed of silicon oxide, that is, the same material as the plurality of insulating layers 140, the gate isolation layer 160 may remain without being removed during an etching process included in the manufacturing process.

Next, with reference to FIGS. 8, 9, and 10, methods of fabricating memory devices 100, 100', and 100" illustrated in FIGS. 4, 5, and 6 will be described, respectively.

FIGS. 8A to 8F are diagrams schematically illustrating processes in a method of fabricating memory devices according to some embodiments of the present inventive concepts.

Figure 8A:
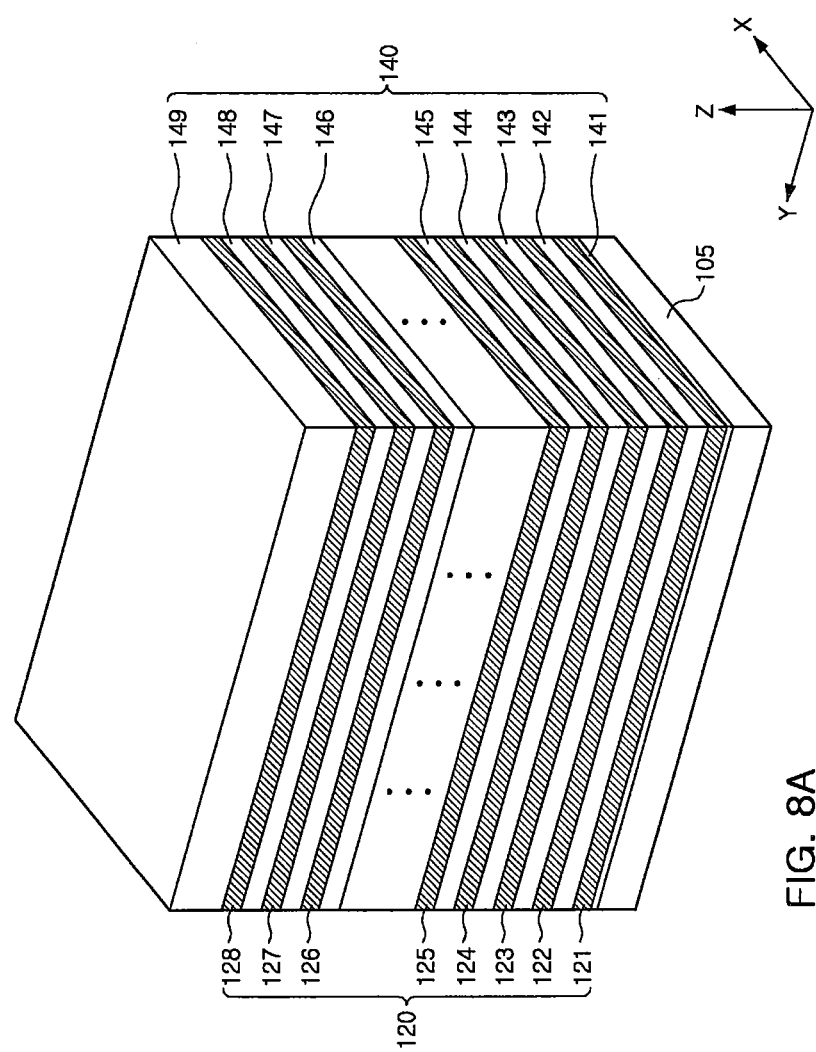
FIGS. 8A to 8F are diagrams schematically illustrating processes in methods of fabricating memory devices according to some embodiments of the present inventive concepts.

Referring to FIG. 8A, a plurality of sacrificial layers 120 (including layers 121 to 128) and a plurality of insulating layers 140 (including layers 141 to 149) may be alternately stacked on an upper surface of the substrate 105. The plurality of sacrificial layers 120 may be formed of a material having a high etch selectivity with respect to the plurality of insulating layers 140 to be selectively etched. Such an etch selectivity may be quantitatively expressed using a ratio of an etching rate of the sacrificial layers 120 to an etching rate of the insulating layers 140. For example, the insulating layers 140 may be one of a silicon oxide layer and a silicon nitride layer, and the sacrificial layers 120 may be a layer selected from a silicon layer, a silicon oxide layer, a silicon carbide layer, and a silicon nitride layer, which is a different material from the insulating layers 140. For example, when the insulating layers 140 include silicon oxide, the sacrificial layers 120 may include silicon nitride.

According to various embodiments of the present inventive concepts, thicknesses of the plurality of insulating layers 140 may be different from each other. For example, the lowermost insulating layer 141 in the z-axis direction among the plurality of insulating layers 140 may be thinner than the other insulating layers 142 to 149, and the uppermost insulating layer 149 may be relatively thicker than the other insulating layers 141 to 148. That is, the thicknesses of the plurality of insulating layers 140 and the plurality of sacrificial layers 120 may not be limited to those illustrated in FIG. 8A, and the numbers of layers that define the plurality of insulating layers 140 and sacrificial layers 120 may also vary.

Figure 8B:
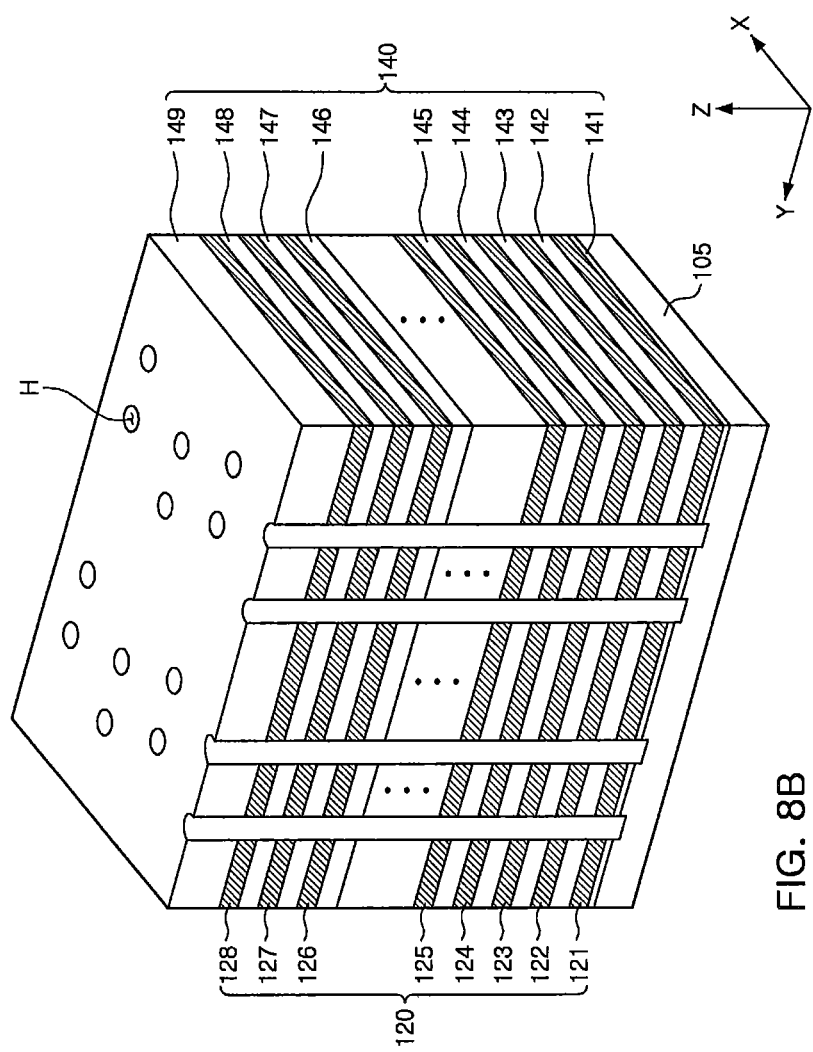

Next, referring to FIG. 8B, a plurality of hole-shaped openings H passing through the plurality of sacrificial layers 120 and the plurality of insulating layers 140 may be formed. The openings H may be arranged to correspond to the plurality of channel areas CH described with respect to FIG. 4.

The openings H illustrated in FIG. 8B may be formed by anisotropically etching the plurality of sacrificial layers 120 and the plurality of insulating layers 140. Since a stacked structure including different layers is etched, the openings H may not be completely perpendicular to the upper surface of the substrate 105. For example, a width of each opening H may be reduced toward the upper surface of the substrate 105. Each opening H may penetrate a portion of substrate 105 from the upper surface of the substrate 105.

Figure 8C:
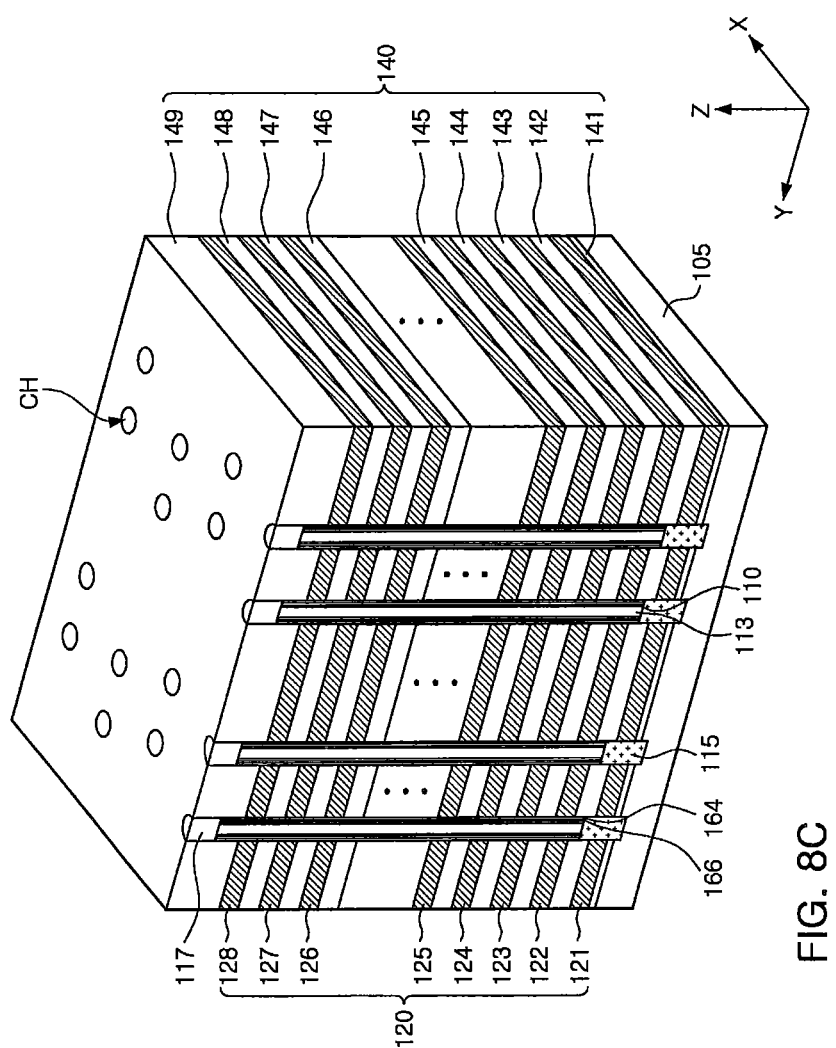

Referring to FIG. 8C, channel layers 110, embedded insulating layers 113, and gate dielectric layers 164 and 166 may be formed in the openings H. In some embodiments, before the channel layers 110, the embedded insulating layers 113, and the gate dielectric layers 164 and 166 are formed, epitaxial layers 115 may be formed on portions of the substrate 105 penetrated by the openings H. Upper surfaces of the epitaxial layers 115 may be higher than an upper surface of the sacrificial layer 121, which will be substituted by a gate electrode layer 131 of ground select transistors GST (as shown in FIG. 4).

Thicknesses of the channel layers 110, the embedded insulating layers 113, and the gate dielectric layers 164 and 166 included in the channel areas CH may be the same or different from each other, and may not be limited to the those illustrated in FIG. 8C. The gate dielectric layers 164 and 166 may be uniformly formed using an atomic layer deposition (ALD) method or a chemical vapor deposition (CVD) method. As illustrated in FIG. 8C, a charge storage layer 164 and a tunneling layer 166 may be formed in each of the openings H, or a blocking layer 162, the charge storage layer 164, and the tunneling layer 166 may be formed in each of the openings H.

After the gate dielectric layers 164 and 166 are formed, the channel layers 110 may be formed thereon. In order for lower surfaces of the channel layers 110 to be in direct contact with the upper surfaces of the substrate 105 or epitaxial layers 115, portions of the gate dielectric layers 164 and 166 may be removed from the upper surfaces of the substrate 105 or epitaxial layers 115 before the channel layers 110 are formed.

The embedded insulating layers 113 may be formed to fill spaces formed on the channel layers 110, and include an insulating material. However, in other embodiments, the spaces of the channel layers 110 may be filled not with the embedded insulating layers 113 but with a conductive material. Drain areas 117 electrically connected to the channel layers 110 may be formed on the embedded insulating layers 113, and the drain areas 117 may be electrically connected to bit lines 13L1 to ELm, which will be formed in a subsequent process.

In some embodiments, before the embedded insulating layers 113 are formed, a hydrogen annealing process in which the channel layers 110 are further subjected to heat treatment in a gaseous atmosphere containing hydrogen or deuterium. By the hydrogen annealing process, many portions of crystal defects existing in the channel layers 110 may be cured.

Next, a planarization process may be performed to remove unnecessary semiconductor material and insulating material covering the uppermost insulating layer 149. Next, some of upper portions of the embedded insulating layers 113 may be removed using an etching process, and a material forming drain areas 117 may be deposited on the removed portions of the embedded insulating layers 113. By performing a planarization process again, the drain areas 117 may be formed.

Figure 8D:
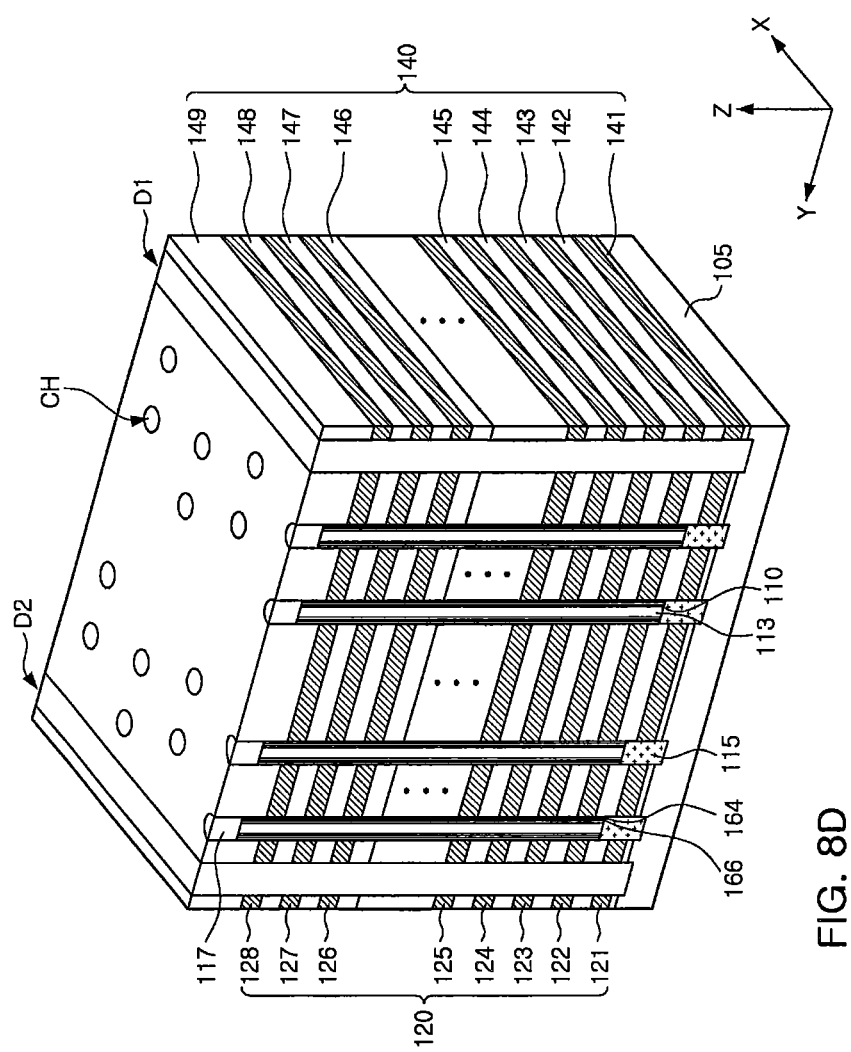

Referring to FIG. 8D, a plurality of isolation areas D1 and D2 dividing the plurality of sacrificial layers 120 and interlayer insulating layers 140 may be formed. Each of the isolation areas D1 and D2 may be formed by an anisotropic etching process using a mask layer, like the openings H illustrated in FIG. 8B. At least portions of the substrate 105 may be exposed by the isolation areas D1 and D2, and source areas 107 (as shown in FIG. 4) may be formed on the portions exposed by the isolation areas D1 and D2 in a subsequent ion-implantation process.

Figure 8E:
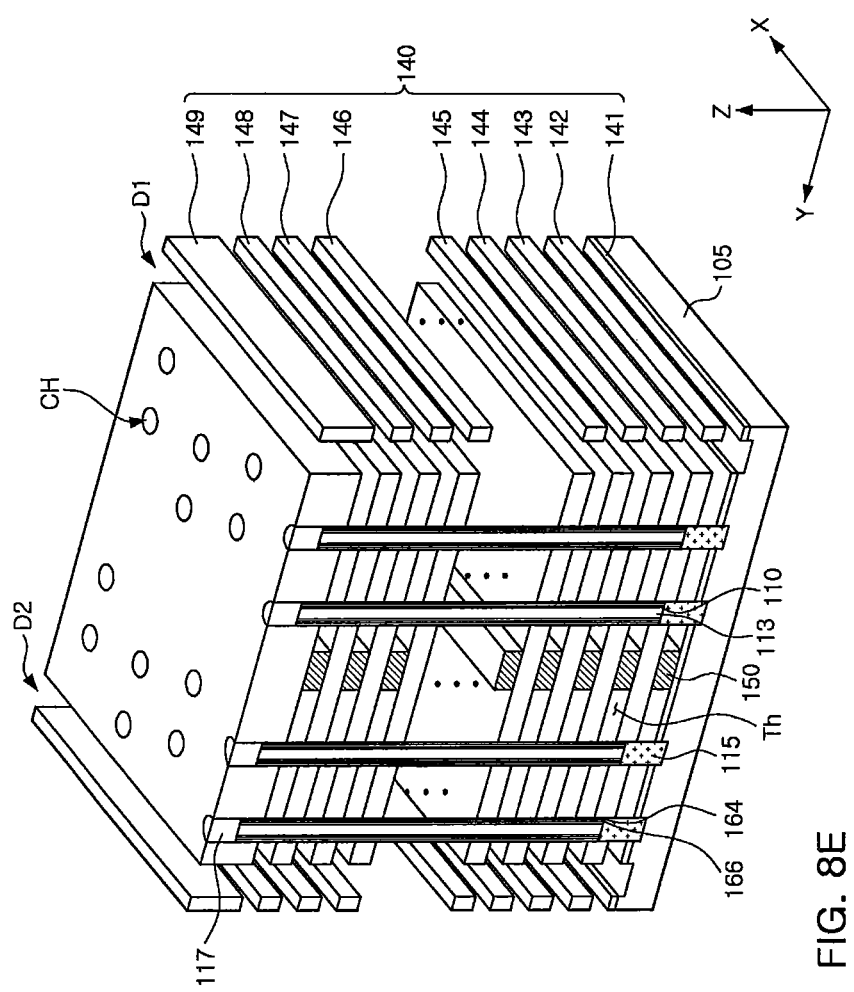

Referring to FIG. 8E, the plurality of sacrificial layers 120 may be removed by an etching process.

The plurality of sacrificial layers 120 except the plurality of interlayer insulating layers 140 may be selectively removed by an etchant flowing into each of the isolation areas D1 and D2. By removing the plurality of sacrificial layers 120, a plurality of horizontal openings Th may be formed between the interlayer insulating layers 140, and portions of side surfaces of the gate dielectric layers 164 may be exposed.

Referring to FIG. 8E, the plurality of sacrificial layers 120 may not be fully removed, and at least a portion of the sacrificial layers 120 may remain. The remaining portion of the sacrificial layers 120 may be provided as an isolation insulating layer 150, which divides each of the plurality of gate electrode layers 130 in a unit cell region UC into electrically separate portions. In the embodiment illustrated in FIG. 8E, all sacrificial layers 120 may remain in a center portion of the unit cell region UC in a y-axis direction.

Figure 8F:
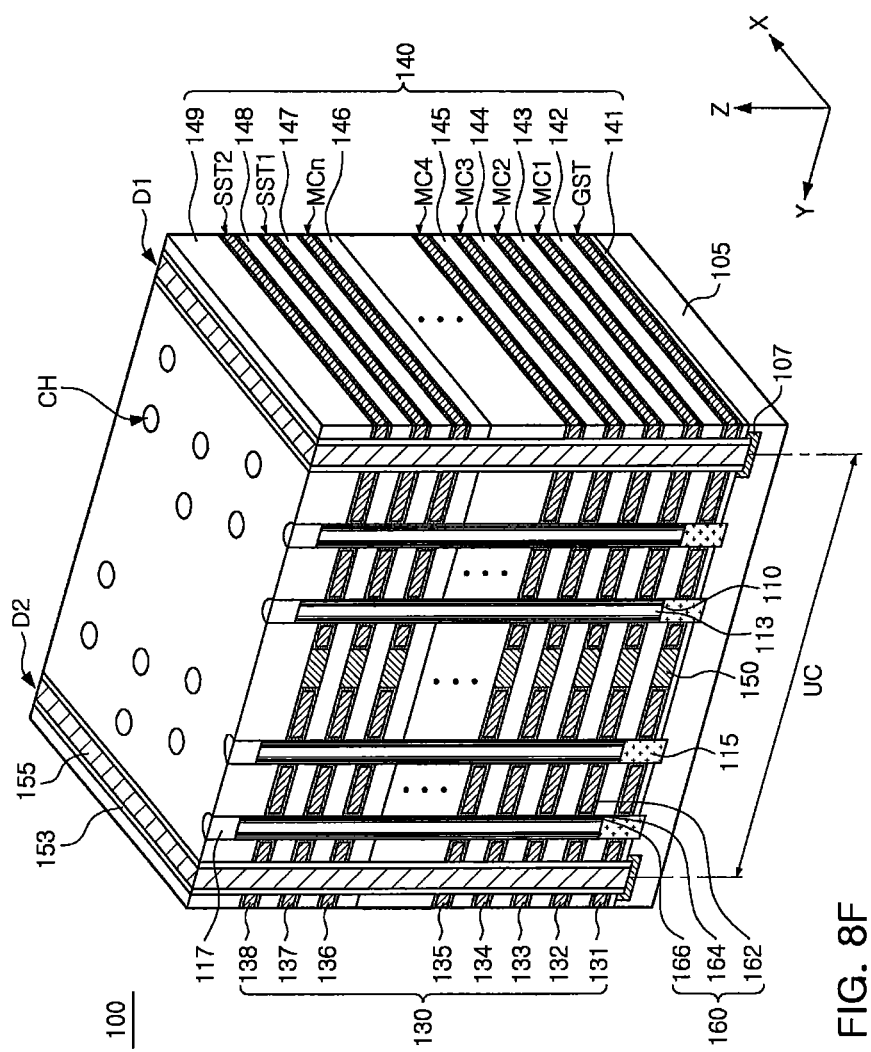

Next, referring to FIG. 8F, the gate electrode layers 130 may be formed in the plurality of horizontal openings Th formed by removing the sacrificial layers 120. In this case, before the gate electrode layers 130 are formed, blocking layers 162 may be formed on inner walls of the horizontal openings Th. The gate electrode layers 130 may include a metal, polysilicon, and/or a metal silicide material. The metal silicide material may include, for example, a silicide material of a metal selected from Co, Ni, Hf, Pt, W, and Ti, or combinations thereof. When the gate electrode layers 130 are formed of a metal silicide material, the gate electrode layers 130 may be formed by filling the horizontal openings Th with Si, forming an additional metal layer, and performing a silicidation process.

When the gate electrode layers 130 are formed, source areas 107 may be formed by injecting impurities in portions of the substrate 105 exposed by the plurality of isolation areas D1 and D2. When the source areas 107 are formed, isolation insulating layers 153 and common source lines 155 may be formed on the source areas 107. The common source lines 155 may be selectively formed according to various embodiments of the present inventive concepts, and contact plugs electrically connected to the common source lines 155 may further be formed in the isolation areas D1 and D2.

FIGS. 9A to 9F are diagrams schematically illustrating processes in a method of fabricating memory devices according to some embodiments of the present inventive concepts.

Figure 9A:
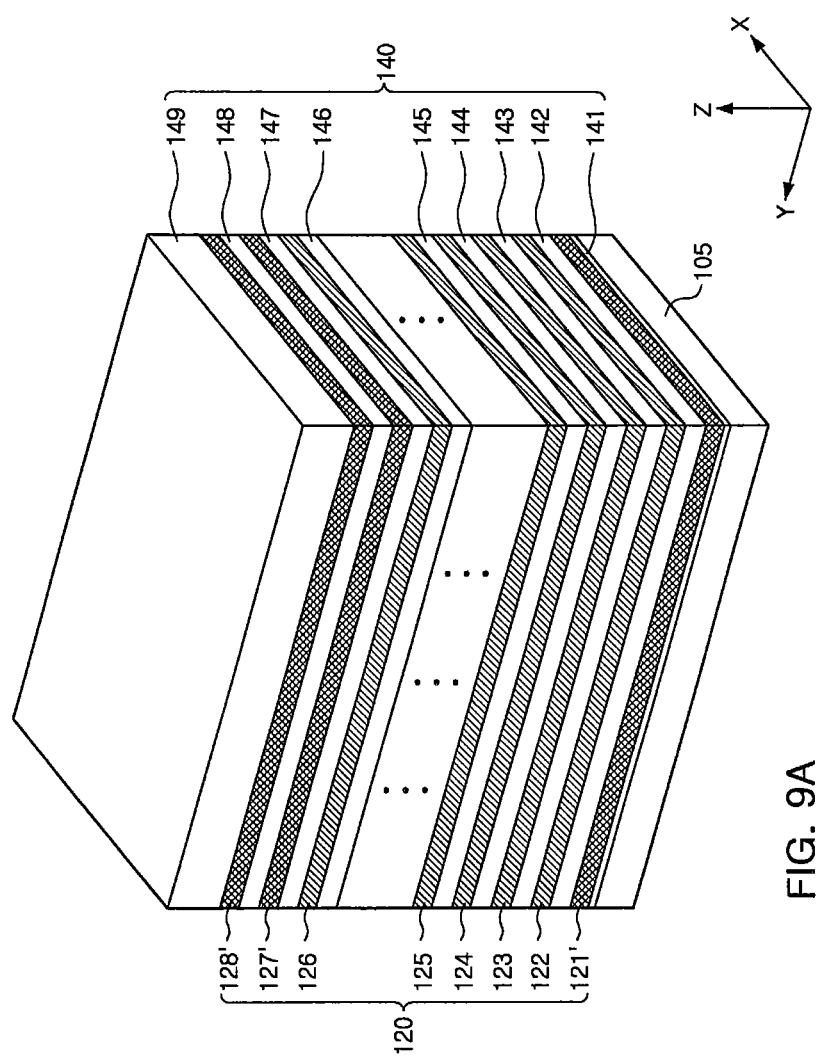
FIGS. 9A to 9F are diagrams schematically illustrating processes in methods of fabricating memory devices according to some embodiments of the present inventive concepts.

Referring to FIG. 9A, a plurality of sacrificial layers 121' to 128': 120 and a plurality of insulating layers 140 (including layers 141 to 149) may be alternately formed on an upper surface of a substrate 105. Like the embodiment illustrated in FIG. 8A, the plurality of sacrificial layers 120 may be formed of a material having a high etch selectivity with respect to the plurality of insulating layers 140. In some embodiments, when the insulating layers 140 include silicon oxide, the sacrificial layers 120 may include silicon nitride.

In the embodiment illustrated in FIG. 9A, the lowermost sacrificial layer 121' and the uppermost sacrificial layers 127' and 128' in a direction of stack (in a z-axis direction of FIG. 9A) may have different characteristics from the other sacrificial layers 122 to 126. In some embodiments, the lowermost sacrificial layer 121' and the uppermost sacrificial layers 127' and 128' may have a lower etching rate than the other sacrificial layers 122 to 126. That is, when the sacrificial layers 120 are selectively etched with respect to the plurality of insulating layers 140, portions of the lowermost sacrificial layer 121' and the uppermost sacrificial layers 127' and 128' may remain even when the other sacrificial layers 122 to 126 are etched and removed.

Meanwhile, as described with reference to FIG. 8A, according to various embodiments of the present invention, thicknesses of the plurality of insulating layers 140 may be different from each other. For example, the lowermost insulating layer 141 in the z-axis direction among the plurality of insulating layers 140 may be thinner than the other insulating layers 142 to 149, and the uppermost insulating layer 149 may be relatively thicker than the other insulating layers 141 to 148. That is, the thicknesses of the plurality of insulating layers 140 and the plurality of sacrificial layers 120 may not be limited to those illustrated in FIG. 9A, and may vary. In addition, the number of layers that define the plurality of insulating layers 140 and the plurality of sacrificial layers 120 may vary.

Figure 9B:
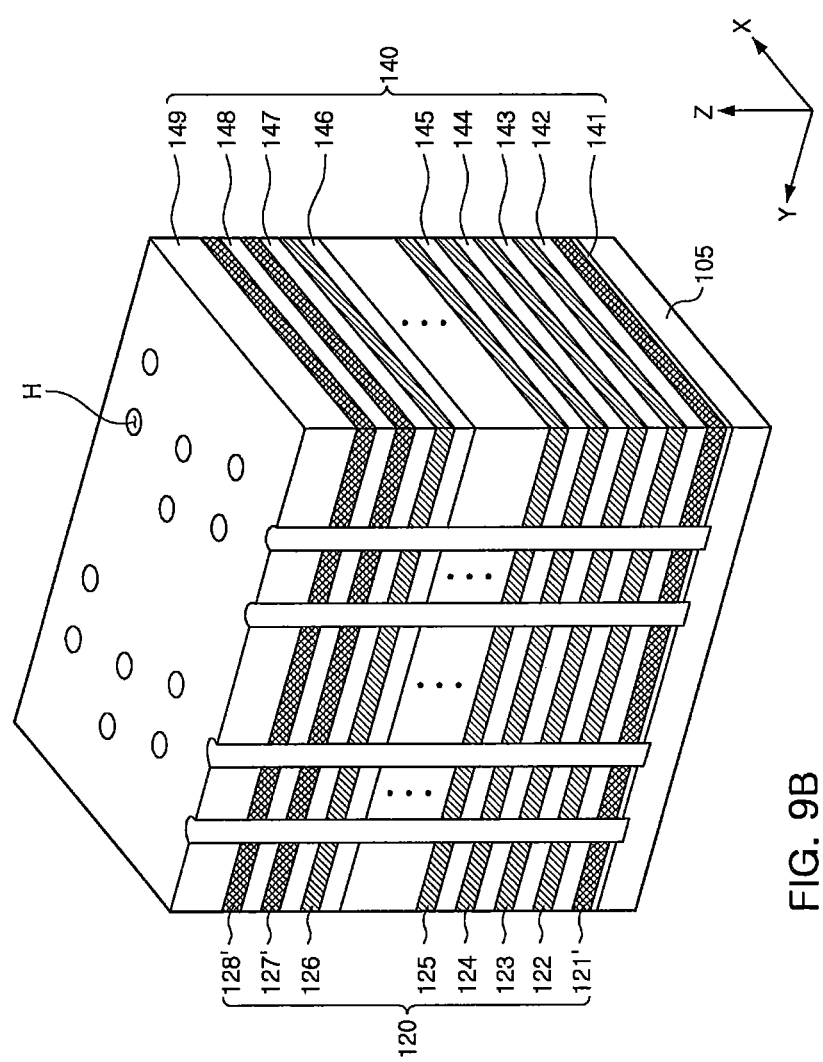

Next, referring to FIG. 9B, a plurality of hole-shaped openings H passing through the plurality of sacrificial layers 120 and the plurality of insulating layers 140 may be formed. The openings H may be arranged to correspond to the plurality of channel areas CH described with reference to FIG. 5. The openings H illustrated in FIG. 9B may be formed by anisotropically etching the plurality of sacrificial layers 120 and the plurality of insulating layers 140 through portions exposed by a mask layer.

Figure 9C:
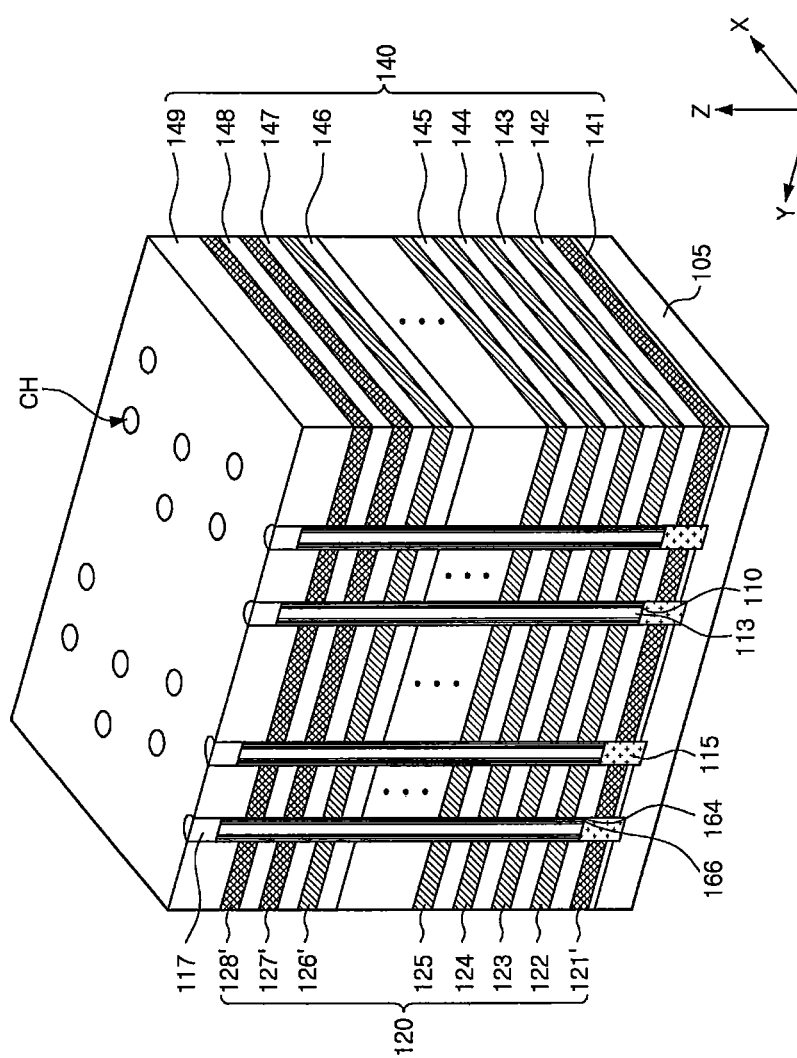

Referring to FIG. 9C, channel layers 110, embedded insulating layers 113, and gate dielectric layers 164 and 166 may be formed in the openings H. In some embodiments, before the channel layers 110, the embedded insulating layers 113, and the gate dielectric layers 164 and 166 are formed, epitaxial layers 115 may be formed on portions of the substrate 105 penetrated by the openings H. Upper surfaces of the epitaxial layers 115 may be higher than an upper surface of the lowermost sacrificial layer 121', which will be substituted by a gate electrode layer 131 of ground select transistors GST (as shown in FIG. 5).

The gate dielectric layers 164 and 166 may be formed in the openings H, and the channel layers 110 may be formed on the gate dielectric layers 164 and 166. In order for lower surfaces of the channel layers 110 to be in direct contact with upper surfaces of the substrate 105 or epitaxial layers 115, portions of the gate dielectric layers 164 and 166 may be removed from the upper surfaces of the substrate 105 or epitaxial layers 115 before the channel layers 110 are formed.

The embedded insulating layer 113 may be formed to fill spaces formed on the channel layers 110 and include an insulating material. However, in other embodiments, the spaces of the channel layers 110 may be filled not with the embedded insulating layers 113 but with a conductive material. Drain areas 117 electrically connected to the channel layers 110 may be formed on the embedded insulating layers 113, and the drain areas 117 may be electrically connected to bit lines BL1 to BLm, which will be formed in a subsequent process.

In some embodiments, before the embedded insulating layers 113 are formed, a hydrogen annealing process in which the channel layers 110 are further subjected to heat treatment in a gaseous atmosphere containing hydrogen or deuterium. By the hydrogen annealing process, many portions of crystal defects existing in the channel layers 110 may be cured.

Next, a planarization process may be performed to remove unnecessary semiconductor material and insulating material covering the uppermost insulating layer 149. Next, some of upper portions of the embedded insulating layers 113 may be removed using an etching process, and a material forming drain areas 117 may be deposited on the removed portions of the embedded insulating layers 113. By performing a planarization process again, the drain areas 117 may be formed.

Figure 9D:
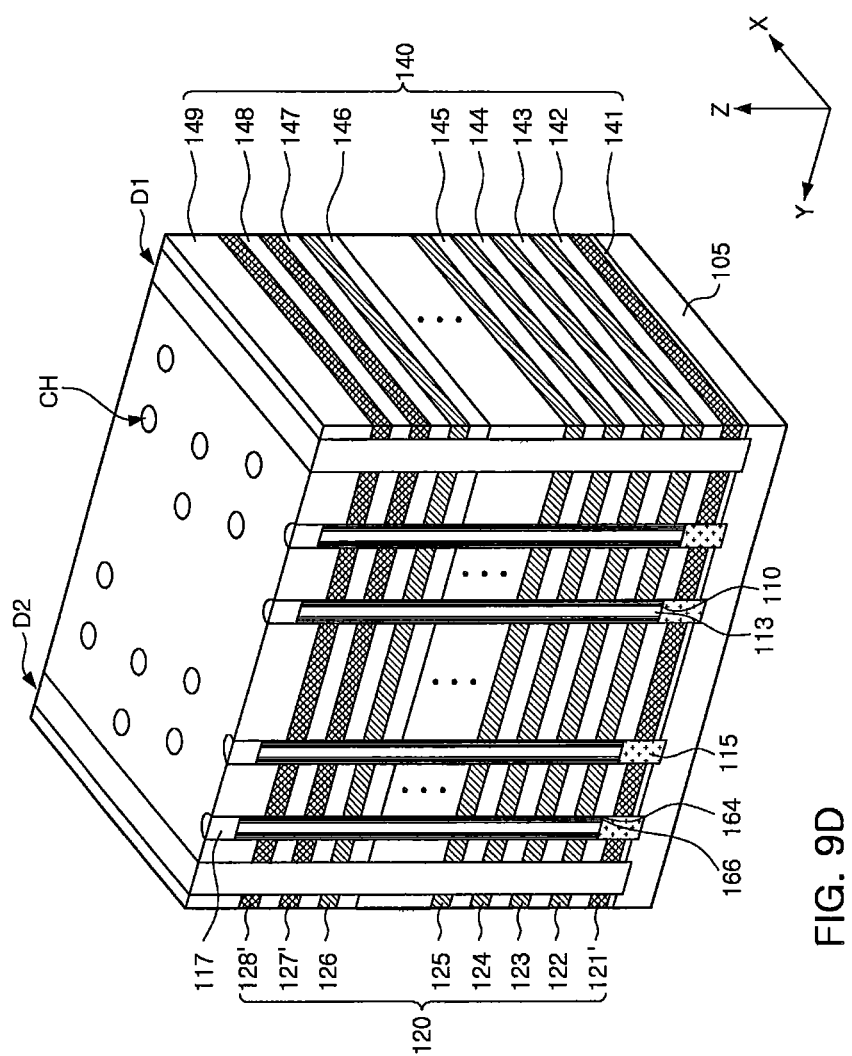

Referring to FIG. 9D, a plurality of isolation areas D1 and D2 dividing the plurality of sacrificial layers 120 and interlayer insulating layers 140 may be formed. Each of the isolation areas D1 and D2 may be formed by an anisotropic etching process using a mask layer, like the openings H illustrated in FIG. 8B. At least portions of the substrate 105 may be exposed by the isolation areas D1 and D2, and source areas 107 (as shown in FIG. 5) may be formed on the portions exposed by the isolation areas D1 and D2 in a subsequent ion-implantation process.

Figure 9E:
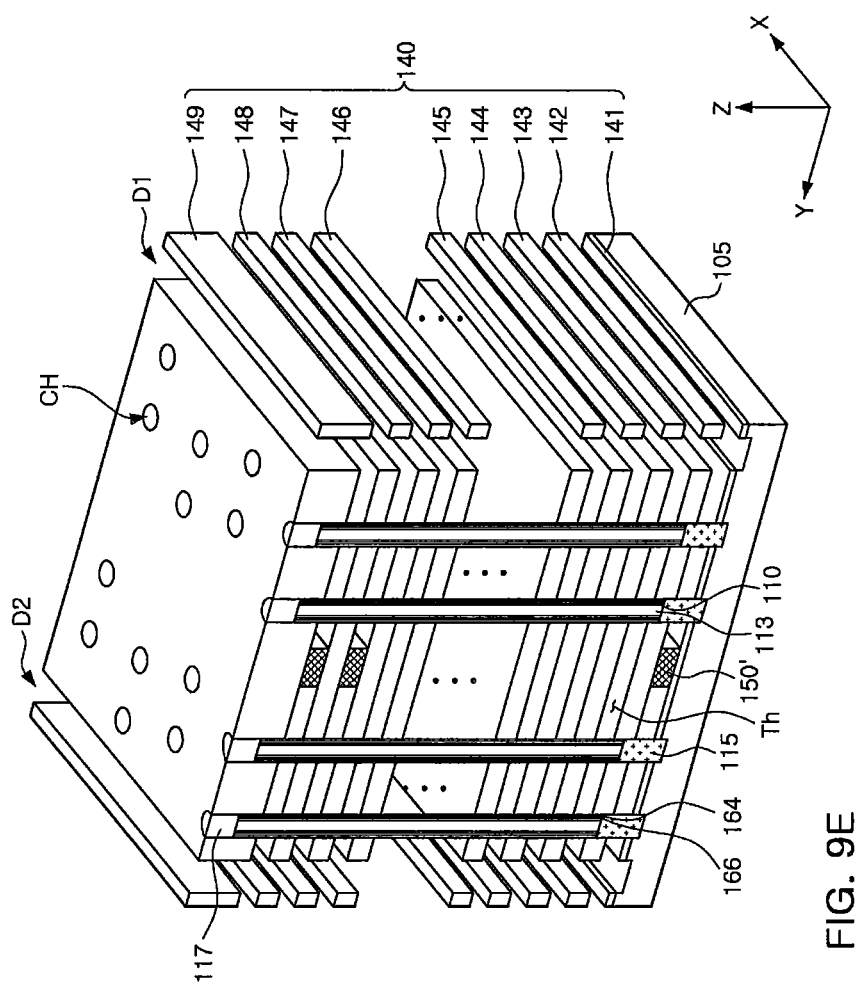

Referring to FIG. 9E, the plurality of sacrificial layers 120 may be removed by an etching process.

The plurality of sacrificial layers 120 except the plurality of interlayer insulating layers 140 may be removed by an etchant flowing into each of the isolation areas D1 and D2. By removing the plurality of sacrificial layers 120, a plurality of horizontal openings Th may be formed between the interlayer insulating layers 140, and portions of side surfaces of the gate dielectric layers 164 may be exposed.

As described with reference to FIG. 9A, the lowermost sacrificial layer 121' and the uppermost sacrificial layers 127' and 128' may have a lower etching rate than the other sacrificial layers 122 to 126. In some embodiments, when the lowermost sacrificial layer 121' and the uppermost sacrificial layers 127' and 128' include high temperature SiN (HT-SiN) formed by a high temperature PECVD or LPCVD process, the other sacrificial layers 122 to 126 may include low stress SiN (LS-SiN).

Referring to FIG. 9E, while the intermediate sacrificial layers 122 to 126 in the direction of stack are fully or almost entirely removed, portions of the lowermost sacrificial layer 121' and the uppermost sacrificial layers 127' and 128' may not be fully removed and may remain. The remaining portions of the lowermost sacrificial layer 121' and the uppermost sacrificial layers 127' and 128' may be provided as an isolation insulating layer 150', which divides ones of the plurality of gate electrode layers 130 in a unit cell region UC into electrically separate portions.

Figure 9F:
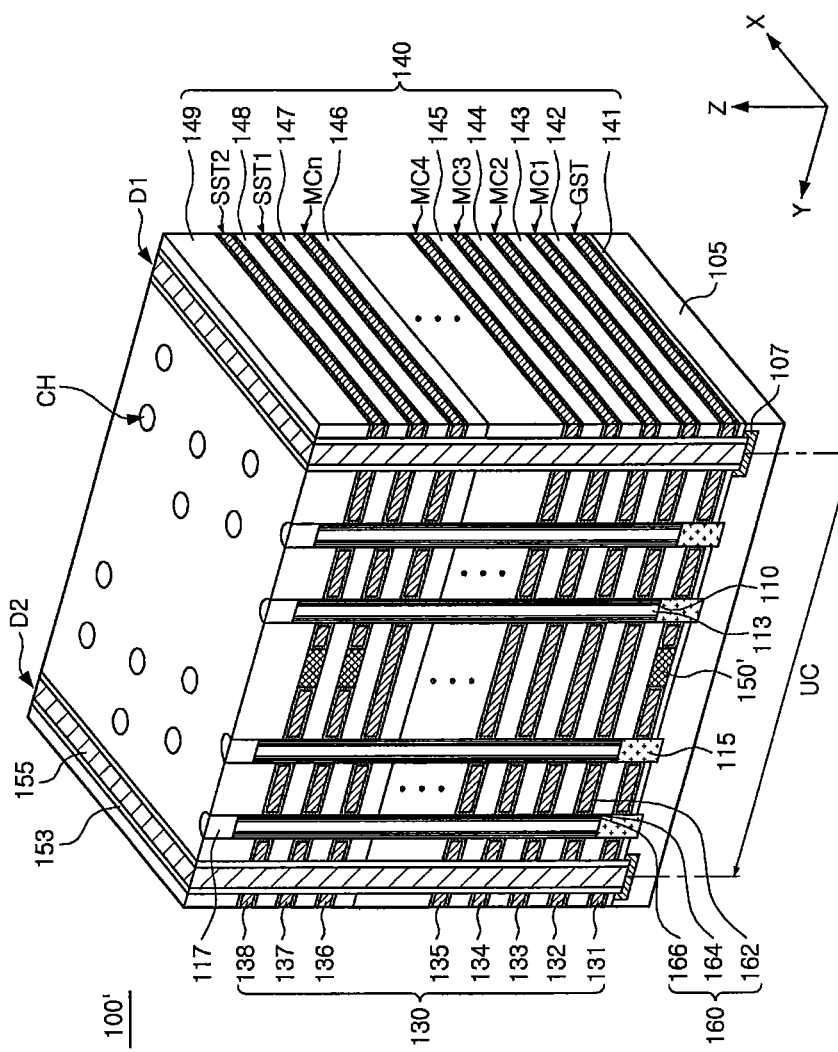

Next, referring to FIG. 9F, the gate electrode layers 130 may be formed in the plurality of horizontal openings Th formed by removing the sacrificial layers 120. In this case, before the gate electrode layers 130 are formed, blocking layers 162 may be formed on inner walls of the horizontal openings Th. The gate electrode layers 130 may include a metal, polysilicon, and/or a metal silicide material. The metal silicide material may include, for example, a silicide material of a metal selected from Co, Ni, Hf, Pt, W, and Ti, or combinations thereof. When the gate electrode layers 130 are formed of a metal silicide material, the gate electrode layers 130 may be formed by filling the horizontal openings Th with Si, forming an additional metal layer, and performing a silicidation process.

When the gate electrode layers 130 are formed, source areas 107 may be formed by injecting impurities in portions of the substrate 105 exposed by the plurality of isolation areas D1 and D2. When the source areas 107 are formed, isolation insulating layers 153 and common source lines 155 may be formed on the source areas 107. The common source lines 155 may be selectively formed according to various embodiments of the present inventive concepts, and contact plugs electrically connected to the common source lines 155 may further be formed in the isolation areas D1 and D2.

FIGS. 10A to 10F are diagrams schematically illustrating processes in a method of fabricating memory devices according to some embodiments of the present inventive concepts.

Figure 10A:
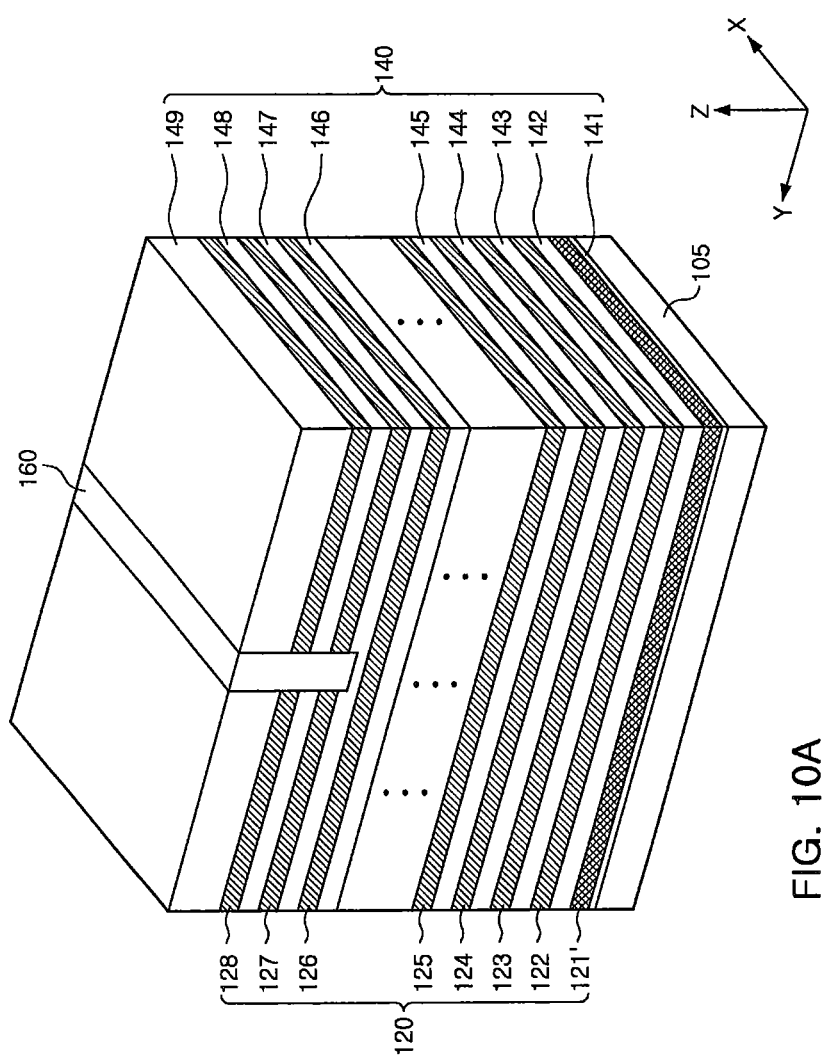
FIGS. 10A to 10F are diagrams schematically illustrating processes in methods of fabricating memory devices according to some embodiments of the present inventive concepts.

Referring to FIG. 10A, a plurality of sacrificial layers 120 (including layers 121' to 128) and a plurality of insulating layers 140 (including layers 141 to 149) may be alternately formed on an upper surface of a substrate 105. As in the embodiments illustrated in FIGS. 8A and 9A, the plurality of sacrificial layers 120 may be formed of a material having a high etch selectivity with respect to the plurality of insulating layers 140. In some embodiments, when the insulating layers 140 include silicon oxide, the sacrificial layers 120 may include silicon nitride.

In the embodiment illustrated in FIG. 10A, the lowermost sacrificial layer 121' in a direction of stack (in a z-axis direction of FIG. 10A) may have different characteristics from the other sacrificial layers 122 to 128. In some embodiments, the lowermost sacrificial layer 121' may have a lower etching rate than the other sacrificial layers 122 to 128. Accordingly, when the sacrificial layers 120 are selectively etched with respect to the plurality of insulating layers 140, portions of the lowermost sacrificial layer 121' may remain even when the other sacrificial layers 122 to 128 are etched and removed. For example, when the lowermost sacrificial layer 121' includes HT-SiN formed by a high temperature PECVD or LPCVD process, the other sacrificial layers 122 to 128 may include LS-SiN.

Meanwhile, portions of the insulating layers 127 and 128 and insulating layers 147 to 149 disposed at a higher level in the stack may be divided by a gate isolation layer 160. The gate isolation layer 160 may be formed after stacking the plurality of sacrificial layers 120 and the insulating layers 140 and removing the portions of the sacrificial layers 120 and the insulating layers 140 for forming the gate isolation layer 160. The gate isolation layer 160 may include the same material as the insulating layers 140, for example, silicon oxide.

Meanwhile, as described with reference to FIGS. 8A and 9A, according to various embodiments of the present inventive concepts, thicknesses of the plurality of insulating layers 140 may be different from each other. For example, the lowermost insulating layer 141 in the z-axis direction among the plurality of insulating layers 140 may be thinner than the other insulating layers 142 to 149, and the uppermost insulating layer 149 may be relatively thicker than the other insulating layers 141 to 148. That is, the thicknesses of the plurality of insulating layers 140 and the plurality of sacrificial layers 120 may not be limited to those illustrated in FIG. 10A, and may vary. In addition, the number of layers that define the plurality of insulating layers 140 and the plurality of sacrificial layers 120 may vary.

Figure 10B:
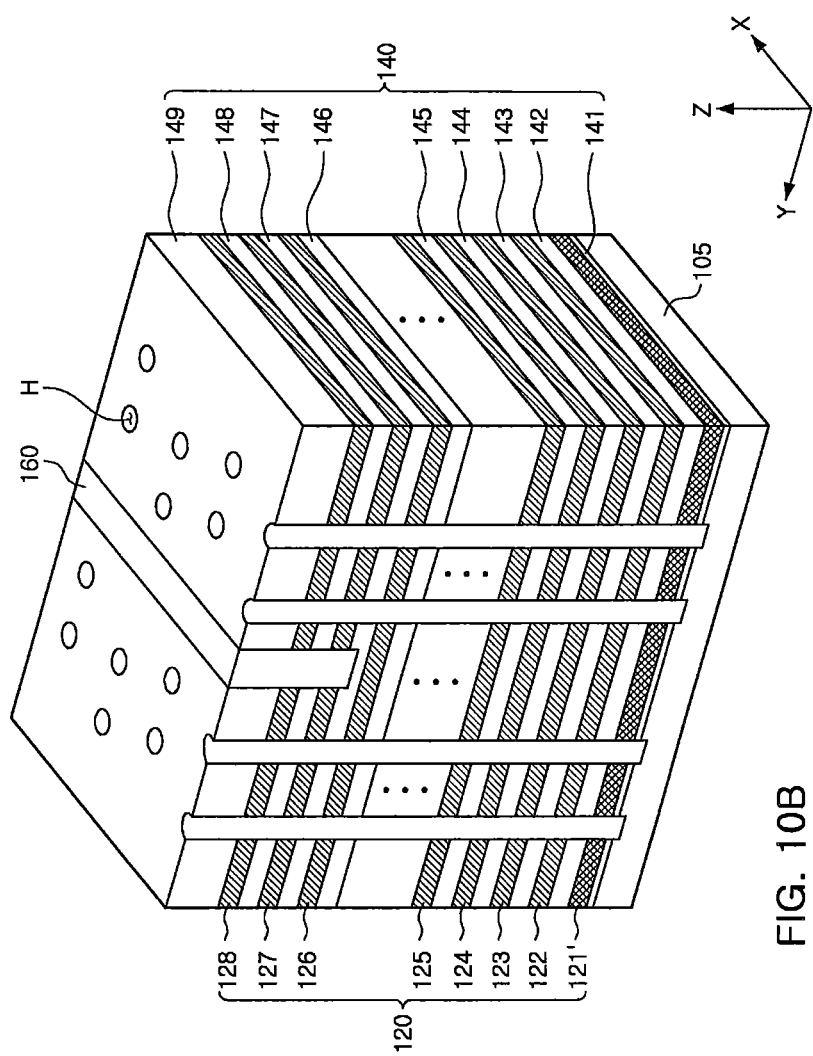

Referring to FIG. 10B, a plurality of hole-shaped openings H passing through the plurality of sacrificial layers 120 and the plurality of insulating layers 140 may be formed. The openings H may be arranged to correspond to the plurality of channel areas CH described with reference to FIG. 6. The openings H illustrated in FIG. 10B may be formed by anisotropically etching the plurality of sacrificial layers 120 and the plurality of insulating layers 140 through portions exposed by a mask layer.

Figure 10C:
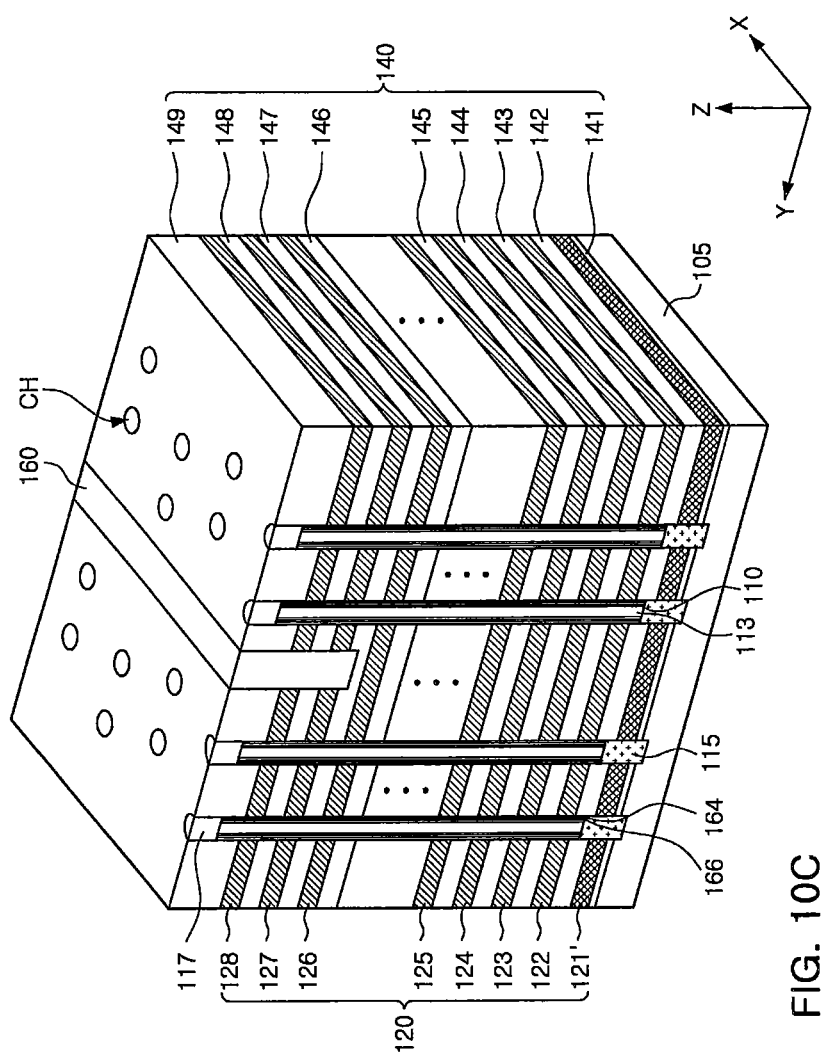

Referring to FIG. 10C, channel layers 110, embedded insulating layers 113, and gate dielectric layers 164 and 166 may be formed in the openings H to define channel structures. In some embodiments, before the channel layers 110, the embedded insulating layers 113, and the gate dielectric layers 164 and 166 are formed, epitaxial layers 115 may be formed on portions of the substrate 105 penetrated by the openings H. Upper surface of the epitaxial layers 115 may be higher than an upper surface of the lowermost sacrificial layer 121', which will be substituted by a gate electrode layer 131 of ground select transistors GST (as shown in FIG. 6).

The gate dielectric layers 164 and 166 may be formed in the openings H, and the channel layers 110 may be formed on the gate dielectric layers 164 and 166. In order for lower surfaces of the channel layers 110 to be in direct contact with upper surfaces of the substrate 105 or epitaxial layers 115, portions of the gate dielectric layers 164 and 166 may be removed from the upper surfaces of the substrate 105 or epitaxial layers 115 before the channel layers 110 are formed.

The embedded insulating layer 113 may be formed to fill spaces formed on the channel layers 110 and include an insulating material. However, in other embodiments, the spaces of the channel layers 110 may be filled not with the embedded insulating layers 113 but with a conductive material. Drain areas 117 electrically connected to the channel layers 110 may be formed on the embedded insulating layers 113, and the drain areas 117 may be electrically connected to bit lines BL1 to BLm, which will be formed in a subsequent process.

In some embodiments, before the embedded insulating layers 113 are formed, a hydrogen annealing process in which the channel layers 110 are further subjected to heat treatment in a gaseous atmosphere containing hydrogen or deuterium. By the hydrogen annealing process, many portions of crystal defects existing in the channel layers 110 may be cured.

Next, a planarization process may be performed to remove unnecessary semiconductor material and insulating material covering the uppermost insulating layer 149. Next, some of upper portions of the embedded insulating layers 113 may be removed using an etching process, and a material forming drain areas 117 may be deposited on the removed portions of the embedded insulating layers 113. By performing a planarization process again, the drain areas 117 may be formed.

Figure 10D:
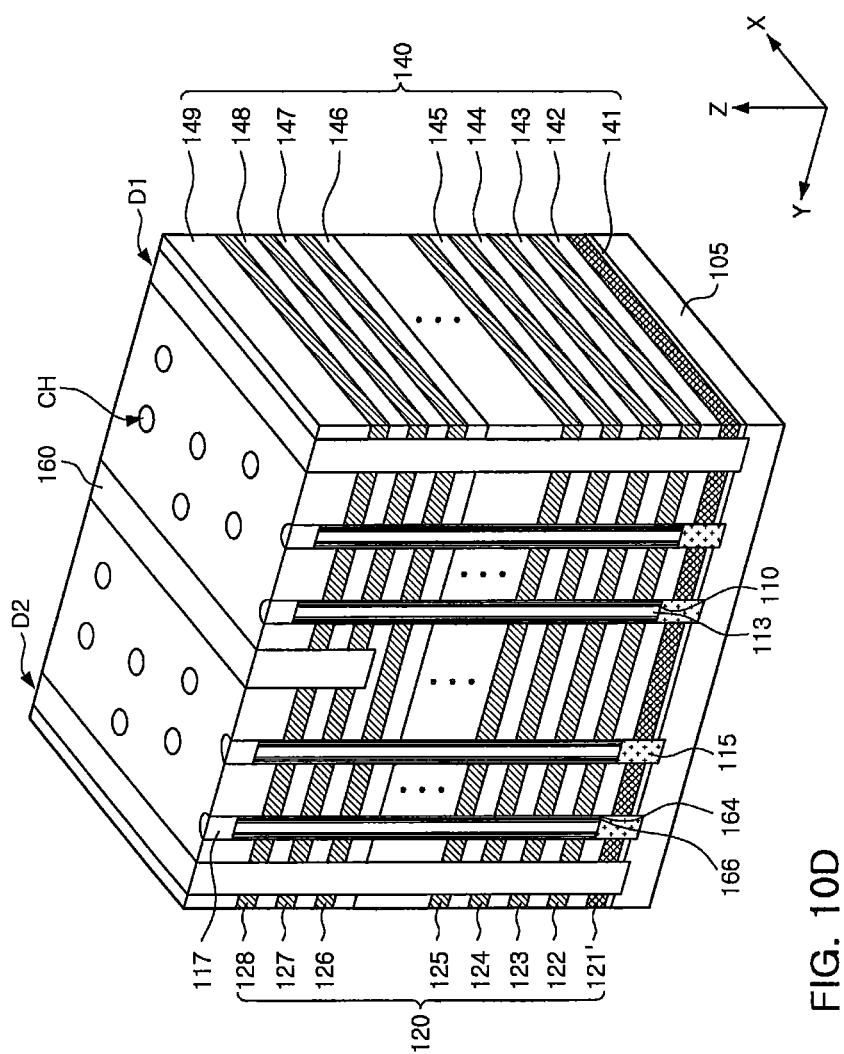

Referring to FIG. 10D, a plurality of isolation areas D1 and D2 dividing the plurality of sacrificial layers 120 and insulating layers 140 may be formed. Each of the isolation areas D1 and D2 may be formed by an anisotropic etching process using a mask layer, like the openings H illustrated in FIG. 8B. At least portions of the substrate 105 may be exposed by the isolation areas D1 and D2, and source areas 107 (as shown in FIG. 6) may be formed on the portions exposed by the isolation areas D1 and D2 in a subsequent ion-implantation process.

Figure 10E:
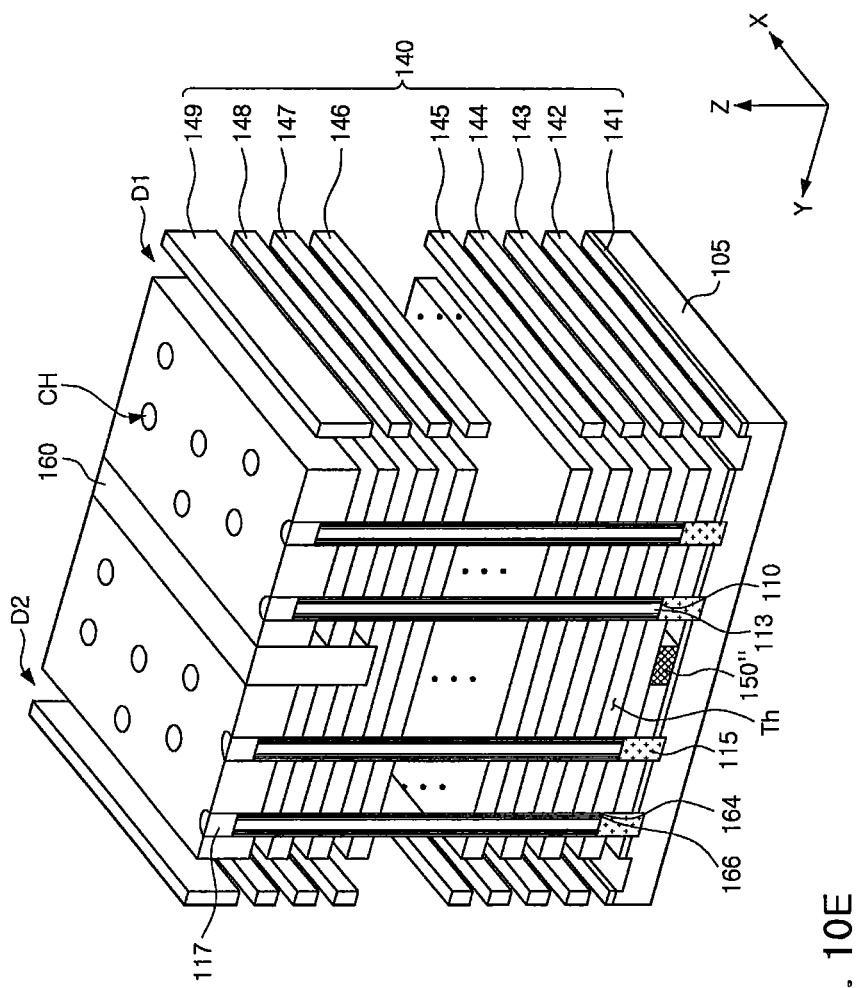

Referring to FIG. 10E, the plurality of sacrificial layers 120 may be removed by an etching process.

The plurality of sacrificial layers 120 except the plurality of insulating layers 140 may be removed by an etchant flowing into each of the isolation areas D1 and D2. By removing the plurality of sacrificial layers 120, a plurality of horizontal openings Th may be formed between the insulating layers 140, and portions of side surfaces of the gate dielectric layers 164 may be exposed.

As described with reference to FIG. 10A, the lowermost sacrificial layer 121' may have a lower etching rate than the other sacrificial layers 122 to 128, and the gate isolation layer may include the same material as the plurality of insulating layers 140. Accordingly, while the other sacrificial layers 122 to 128 are fully or almost entirely etched and removed, portions of the lowermost sacrificial layer 121' and the gate isolation layer 160 may not be fully removed and may remain. The remaining portions of the lowermost sacrificial layer 121' may be provided as an isolation insulating layer 150', which divides the gate electrode layer 131 included in the ground select transistors GST in a unit cell region UC into electrically separate portions. Meanwhile, the gate electrode layers 137 and 138 included in the string select transistors SST1 and SST2 may be divided by the gate isolation layer 160.

Figure 10F:
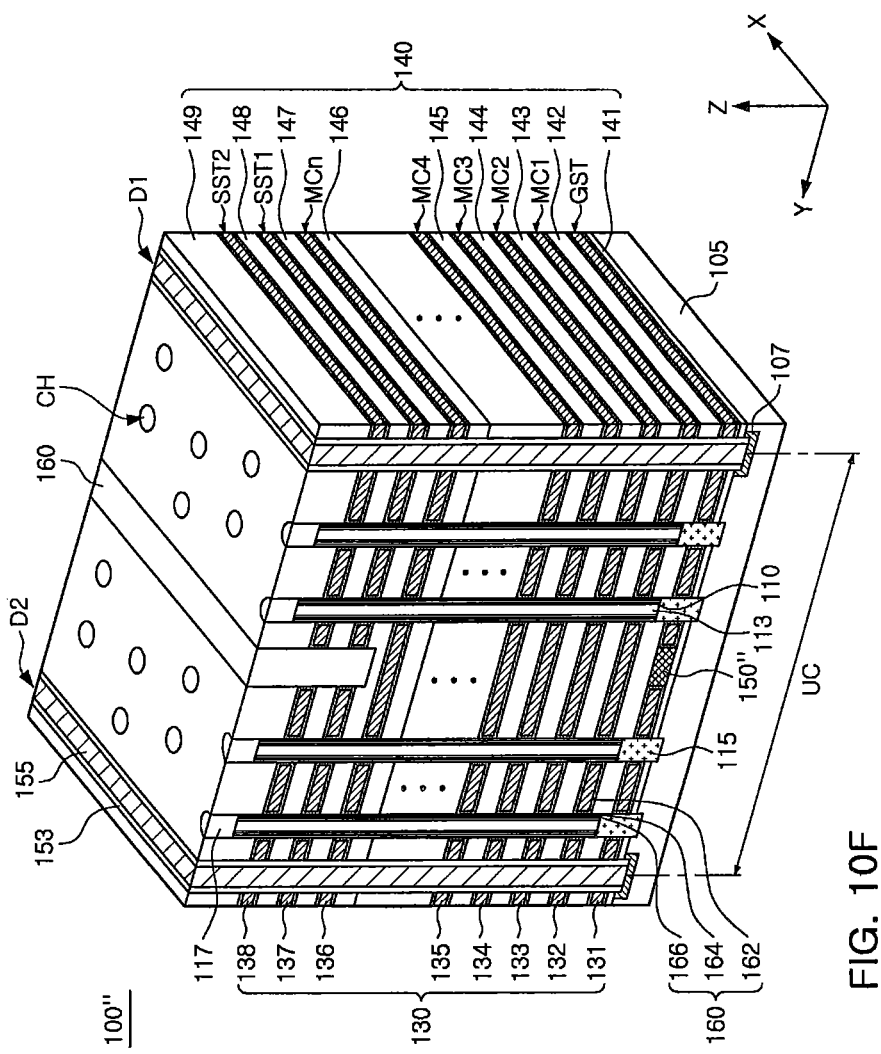

Next, Referring to FIG. 10F, gate electrode layers 130 may be formed in the plurality of horizontal openings Th formed by removing the sacrificial layers 120. In this case, before the gate electrode layers 130 are formed, blocking layers 162 may be formed on inner walls of the horizontal openings Th. The gate electrode layers 130 may include a metal, polysilicon, and/or a metal silicide material. The metal silicide material may include, for example, a silicide material of a metal selected from Co, Ni, Hf, Pt, W, and Ti, or combinations thereof. When the gate electrode layers 130 are formed of a metal silicide material, the gate electrode layers 130 may be formed by filling the horizontal openings Th with Si, forming an additional metal layer, and performing a silicidation process.

When the gate electrode layers 130 are formed, source areas 107 may be formed by injecting impurities in portions of the substrate 105 exposed by the plurality of isolation areas D1 and D2. When the source areas 107 are formed, isolation insulating layers 153 and common source lines 155 may be formed on the source areas 107. The common source lines 155 may be selectively formed according to various embodiments of the present inventive concepts, and contact plugs electrically connected to the common source lines 155 may further be formed in the isolation areas D1 and D2.

Figure 11:
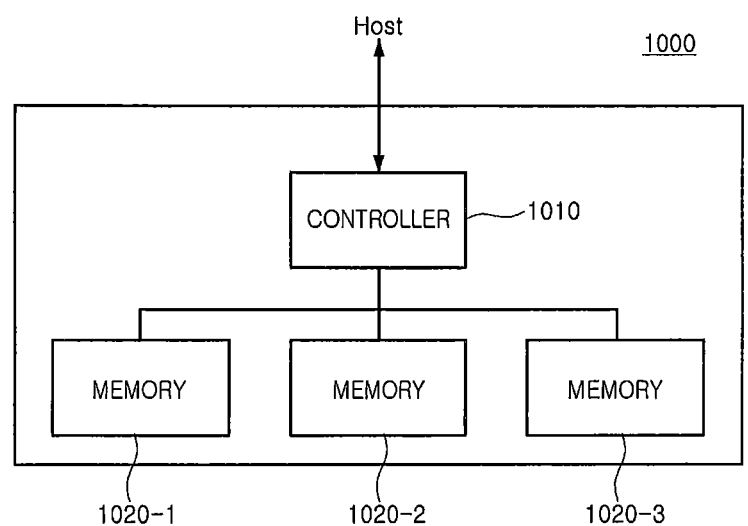
FIGS. 11 and 12 are block diagrams illustrating electronic apparatuses including memory devices according to some embodiments of the present inventive concepts.
Figure 12:
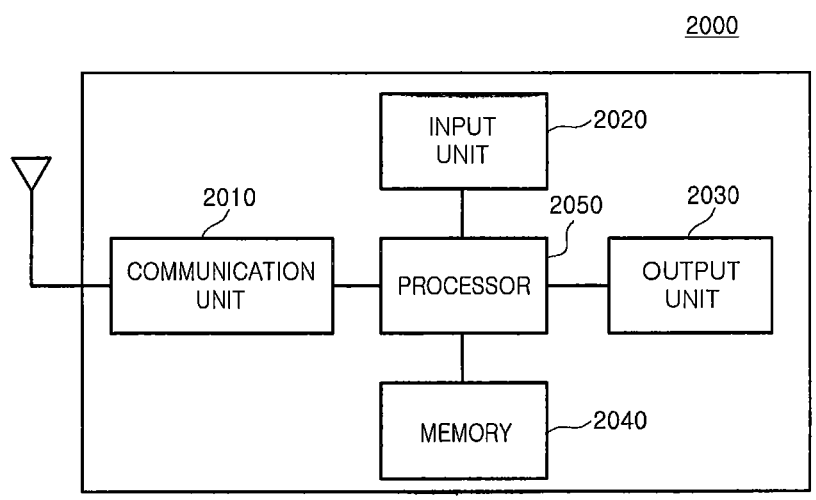

FIGS. 11 and 12 are diagrams provided for describing operations of a process management system according to exemplary embodiments of the present inventive concepts.

FIG. 11 is a block diagram illustrating a storage apparatus including nonvolatile memory devices according to some embodiments of the present inventive concepts.

Referring to FIG. 11, a storage apparatus 1000 according to some embodiments of the present inventive concepts may include a controller 1010 communicating with a host HOST, and memories 1020-1, 1020-2, and 1020-3 storing data. One or more of the memories 1020-1, 1020-2, and 1020-3 may include memory devices according to the various exemplary embodiments of the present inventive concepts, as described for example with reference to FIGS. 3 to 6.

The host HOST communicating with the controller 1010 may include a variety of electronic apparatus or devices in which the storage apparatus 1000 is installed, for example, a smartphone, a digital camera, a desktop PC, a laptop computer, and/or a media player. The controller 1010 may receive a request for data read or write from the host HOST to generate a command CMD for storing data in the memories 1020-1, 1020-2, and 1020-3 or withdrawing data from the memories 1020-1, 1020-2, and 1020-3.

As illustrated in FIG. 11, one or more memories 1020-1, 1020-2, and 1020-3 may be connected to the controller 1010 (for example, in parallel) in the storage apparatus 1000. By connecting the plurality of memories 1020-1, 1020-2, and 1020-3 to the controller 1010 in parallel, a storage apparatus 1000 having a large capacity, such as a solid state drive (SSD), may be provided.

FIG. 12 is a block diagram illustrating an electronic apparatus including nonvolatile memory devices according to some embodiments of the present inventive concepts.

Referring to FIG. 12, an electronic apparatus 2000 according to some embodiments of the present inventive concepts may include a communication unit 2010, an input unit 2020, an output unit 2030, a memory 2040, and a processor 2050.

The communication unit 2010 may include a wired/wireless communications module, such as a wireless internet module, a short-range communications module, a GPS module, and/or a mobile communications module. The wired/wireless communications module included in the communication unit 2010 may be connected to an external communications network by a variety of communications standards to transmit and/or receive data.

The input unit 2020 is a module supplied for a user to control an operation of the electronic apparatus 2000, and includes a mechanical switch, a touch screen, a voice recognition module, and/or the like. In addition, the input unit 2020 may include a track ball, a laser pointer mouse, and/or a touch interaction, and may further include a variety of sensor modules by which a user can input data.

The output unit 2030 may output information processed by the electronic apparatus 2000 in an audio and/or video form. The memory 2040 may store a program for processing or controlling of the processor 2050, and/or data. The memory 2040 may include one or more semiconductor devices according to the various embodiments of the present inventive concepts, described above with reference to FIGS. 3 to 6. The processor 2050 may store/write and/or withdraw/read data by transmitting a command to memory 2040 according to a desired operation.

The memory 2040 may be embedded in the electronic apparatus 2000 or may communicate with the processor 2050 through a separate interface. When the memory 2040 communicates with the processor 2050 through the separate interface, the processor 2050 may store/write data in or withdraw/read data from the memory 2040 by a variety of interface standards, such as SD, SDHC, SDXC, MICRO SD, and/or USB.

The processor 2050 may control operations of each unit included in the electronic apparatus 2000. The processor 2050 may perform controlling and/or processing operations related to voice calls, video calls, and/or data communication, and/or may perform controlling and/or processing operations for multimedia playback and management. In addition, the processor 2050 may process an input transmitted through the input unit 2020 from a user, and output a result thereof through the output unit 2030. Further, the processor 2050 may store data to control operations of the electronic apparatus 2000 in the memory 2040, and/or withdraw the data from the memory 2040, as described above.

As set forth above, according to some embodiments of the present inventive concepts, in a process of removing a sacrificial layer to form a gate electrode layer, at least a portion of a word line may be divided in one unit cell region by retaining a portion of the sacrificial layer. Accordingly, an aspect ratio in the one unit cell region may be lowered, and misalignment of a contact due to a stress of the word line may be reduced or minimized.

While example embodiments have been shown and described above, it will be apparent to those skilled in the art that modifications and variations could be made without departing from the scope of the present invention as defined by the following claims.

What is claimed is:

1. A memory device, comprising:
    a substrate;
    a cell region including at least one ground select transistor, at least one string select transistor, and a plurality of memory cell transistors, defined by respective gate electrode layers stacked on the substrate;
    a plurality of isolation areas dividing the cell region into a plurality of unit cell regions; and
    at least one isolation insulating layer disposed parallel to an upper surface of the substrate between directly adjacent ones of the isolation areas, and dividing at least one of the respective gate electrode layers that define the at least one ground select transistor in the plurality of unit cell regions,
    wherein ones of the respective gate electrode layers that define the plurality of memory cell transistors are not divided by the at least one isolation insulating layer in the plurality of unit cell regions.

2. A memory device, comprising:
    a substrate;
    a cell region including at least one ground select transistor, at least one string select transistor, and a plurality of memory cell transistors, defined by respective gate electrode layers stacked on the substrate;
    a plurality of isolation areas dividing the cell region into a plurality of unit cell regions;
    at least one isolation insulating layer disposed parallel to an upper surface of the substrate between directly adjacent ones of the isolation areas, and dividing at least one of the respective gate electrode layers that define the at least one ground select transistor in the plurality of unit cell regions; and
    a gate isolation layer dividing at least one of the respective gate electrode layers that define the at least one string select transistor,
    wherein the at least one of the respective gate electrode layers that define the at least one string select transistor and the ones of the respective gate electrode layers that define the plurality of memory cell transistors are not divided by the at least one isolation insulating layer.

3. A memory device, comprising:
    a substrate including common source regions thereon;
    common source lines extending along a surface of the substrate and contacting the common source regions, respectively, wherein adjacent ones of the common source lines define a unit cell of the memory device therebetween;
    channel structures on the substrate between the adjacent ones of the common source lines, wherein the channel structures extend away from the surface of the substrate;
    an electrode stack structure including interlayer insulating layers and conductive electrode layers that are alternately stacked along sidewalls of the channel structures, wherein the conductive electrode layers define respective gates of selection transistors and memory cell transistors of the memory device; and
    an isolation insulating layer comprising a portion of a sacrificial layer that is disposed between adjacent ones of the interlayer insulating layers in the stack structure, wherein the portion of the sacrificial layer defining the isolation insulating layer comprises a material having a lower etching rate than other sacrificial layers used in the stack structure,
    wherein the isolation insulating layer divides at least one of the conductive electrode layers in the stack structure into electrically separate portions.

4. The memory device of claim 3, wherein the at least one of the conductive electrode layers, which is divided by the isolation insulating layer, defines a gate of at least one of the selection transistors of the memory device.

5. The memory device of claim 4, wherein the at least one of the selection transistors comprises a ground select transistor, and further comprising:
    a gate isolation layer that divides one or more of the conductive electrode layers in the stack structure into electrically separate portions,
    wherein the one or more of the conductive electrode layers define respective gates of one or more string select transistors, and wherein the gate isolation layer comprises a same material as the interlayer insulating layers in the stack structure.

6. The memory device of claim 4, wherein upper and lower ones of the interlayer insulating layers in the stack structure have different thicknesses than ones of the interlayer insulating layers therebetween in the stack structure.

7. A memory device, comprising:
    a substrate;
    a cell region including at least one ground select transistor, at least one string select transistor, and a plurality of memory cell transistors, defined by respective gate electrode layers stacked on the substrate;
    a plurality of isolation areas dividing the cell region into a plurality of unit cell regions; and
    at least one isolation insulating layer disposed parallel to an upper surface of the substrate between directly adjacent ones of the isolation areas, and dividing at least one of the respective gate electrode layers that define the at least one ground select transistor in the plurality of unit cell regions,
    wherein the at least one isolation insulating layer is confined between respective interlayer insulating layers thereabove and therebelow, wherein the respective interlayer insulating layers are alternatingly stacked between the respective gate electrode layers on the substrate.

* * * * *